(12) United States Patent
Lee et al.

(10) Patent No.: US 9,306,015 B2
(45) Date of Patent: Apr. 5, 2016

(54) SEMICONDUCTOR DEVICE HAVING PLANAR SOURCE ELECTRODE

(71) Applicant: Samsung Electronics Co., Ltd., Suwon-si (KR)

(72) Inventors: Suk-Kyun Lee, Yongin-si (KR); Chan-Ho Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 135 days.

(21) Appl. No.: 14/100,455

(22) Filed: Dec. 9, 2013

(65) Prior Publication Data

US 2014/0291758 A1 Oct. 2, 2014

(30) Foreign Application Priority Data

Mar. 27, 2013 (KR) .................. 10-2013-0032817

(51) Int. Cl.

| H01L 29/66 | (2006.01) |
|---|---|
| H01L 29/417 | (2006.01) |
| H01L 29/78 | (2006.01) |
| H01L 21/265 | (2006.01) |
| H01L 29/40 | (2006.01) |
| H01L 29/423 | (2006.01) |
| H01L 29/45 | (2006.01) |
| H01L 29/08 | (2006.01) |

(52) U.S. Cl.

CPC .... *H01L 29/41766* (2013.01); *H01L 29/66727* (2013.01); *H01L 29/7811* (2013.01); *H01L 29/7813* (2013.01); H01L 21/26586 (2013.01); H01L 29/0869 (2013.01); H01L 29/0878 (2013.01); H01L 29/407 (2013.01); H01L 29/4236 (2013.01); H01L 29/42368 (2013.01); H01L 29/42376 (2013.01); H01L 29/456 (2013.01)

(58) Field of Classification Search

CPC ...................... H01L 29/7827; H01L 29/41741
USPC ......................................................... 257/331
See application file for complete search history.

(56) References Cited

U.S. PATENT DOCUMENTS

| 5,998,833 | A | 12/1999 | Baliga |
|---|---|---|---|
| 6,445,035 | B1 | 9/2002 | Zeng et al. |
| 7,446,374 | B2 | 11/2008 | Thorup et al. |
| 7,504,306 | B2 | 3/2009 | Sapp et al. |
| 7,633,119 | B2 | 12/2009 | Bhalla et al. |
| 7,732,842 | B2 | 6/2010 | Session |
| 7,807,576 | B2 | 10/2010 | Pan |
| 7,952,141 | B2 | 5/2011 | Dunn et al. |
| 8,034,682 | B2 | 10/2011 | Herrick et al. |

(Continued)

FOREIGN PATENT DOCUMENTS

| JP | 2010129973 | 6/2010 |
|---|---|---|
| JP | 2012049499 | 3/2012 |

(Continued)

*Primary Examiner* — Matthew Gordon
(74) *Attorney, Agent, or Firm* — Onello & Mello LLP

(57) ABSTRACT

A semiconductor device includes a channel layer on a substrate; cell trench patterns in the channel layer; and a source pattern on the cell trench patterns. The source pattern includes: grooves, each having inclined sidewalls and bottom that extends in a horizontal direction in a portion of the channel layer between the cell trench patterns, source regions at the inclined sidewalls of the grooves, source isolation regions at the bottoms of the grooves, and a source electrode at interior regions of the grooves and that has a planar upper surface.

4 Claims, 35 Drawing Sheets

(56) References Cited

U.S. PATENT DOCUMENTS

| | | | |
|---|---|---|---|
| 8,053,315 | B2 | 11/2011 | Tai et al. |
| 8,278,702 | B2 | 10/2012 | Pan et al. |
| 2006/0267090 | A1* | 11/2006 | Sapp .................... H01L 29/7827 257/341 |
| 2008/0061322 | A1* | 3/2008 | von Kluge .................... 257/213 |
| 2010/0065904 | A1 | 3/2010 | Pan et al. |
| 2010/0140689 | A1 | 6/2010 | Yedinak et al. |
| 2010/0140695 | A1* | 6/2010 | Yedinak et al. ............... 257/334 |
| 2011/0210406 | A1 | 9/2011 | Terrill et al. |
| 2011/0254088 | A1 | 10/2011 | Darwish et al. |
| 2012/0025874 | A1 | 2/2012 | Saikaku et al. |
| 2012/0037983 | A1 | 2/2012 | Hshieh |
| 2012/0058615 | A1 | 3/2012 | Marchant et al. |
| 2013/0026563 | A1 | 1/2013 | Pan et al. |
| 2013/0221428 | A1* | 8/2013 | Venkatraman et al. ........ 257/330 |
| 2014/0264433 | A1* | 9/2014 | Hu et al. ........................ 257/139 |

FOREIGN PATENT DOCUMENTS

| | | |
|---|---|---|
| KR | 20100032321 | 3/2010 |
| KR | 1020110018510 | 2/2011 |

\* cited by examiner

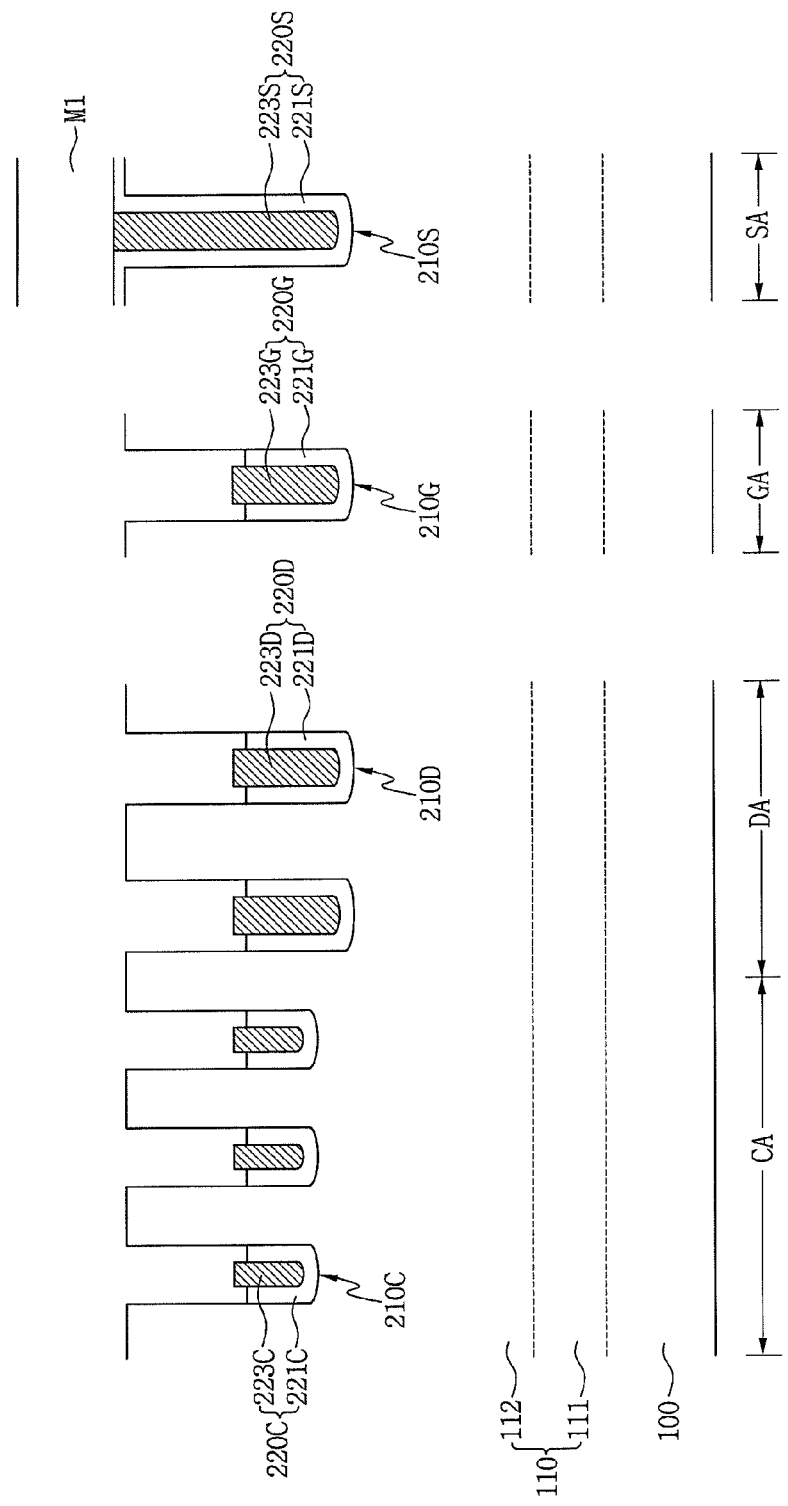

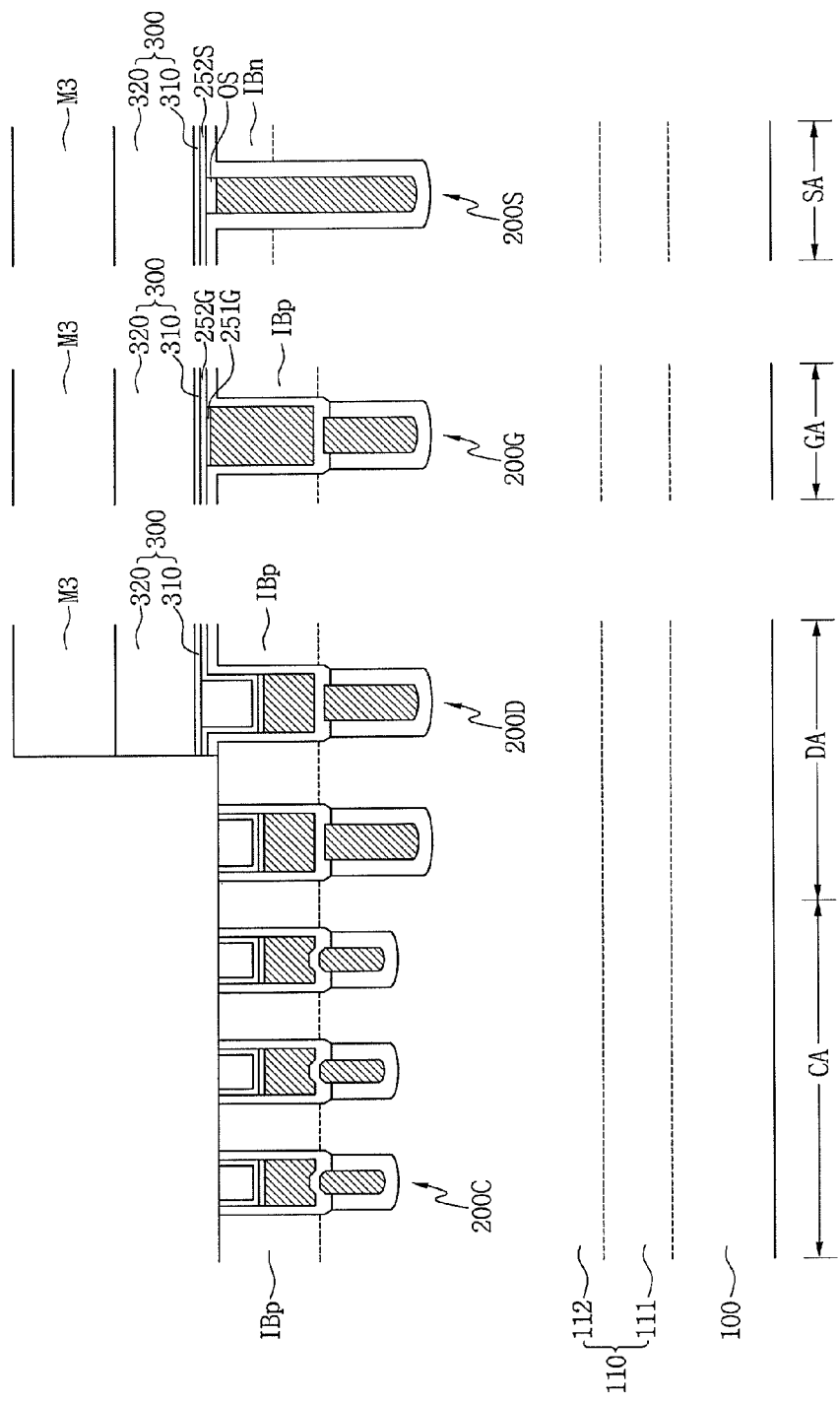

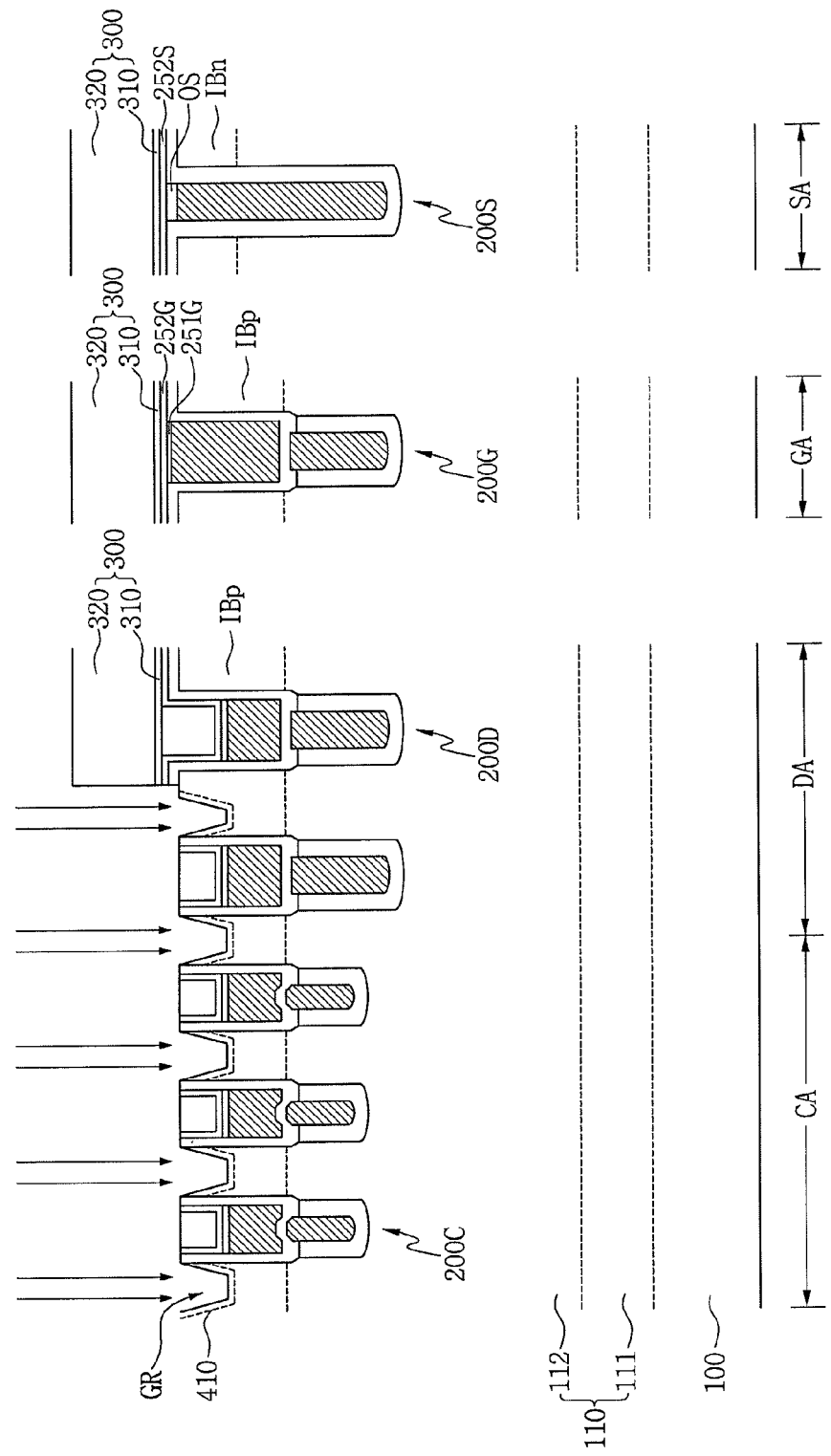

SEMICONDUCTOR DEVICE HAVING PLANAR SOURCE ELECTRODE

CROSS-REFERENCE TO RELATED APPLICATION

This application claims priority under 35 U.S.C. §119 to Korean Patent Application No. 10-2013-0032817 filed on Mar. 27, 2013 in the Korean Intellectual Property Office, the disclosure of which is hereby incorporated by reference in its entirety.

BACKGROUND

1. Field

Embodiments of the inventive concepts relate to a discrete semiconductor device for supplying power, which includes a metal-oxide-semiconductor field effect transistor (MOSFET) for low voltage, and a method of fabricating the same.

2. Description of Related Art

To provide a transistor that reduces contact resistance and increases power efficiency in a semiconductor device for supplying power, a trench-type gate electrode and a shield electrode are employed. Further, various studies for further improving the degree of integration are being made.

SUMMARY

Embodiments of the inventive concepts provide a discrete semiconductor device for supplying power.

Other embodiments of the inventive concepts provide a semiconductor device having a metal-oxide-semiconductor field effect transistor (MOSFET) operable at a low voltage.

Still other embodiments of the inventive concepts provide a method of fabricating a discrete semiconductor device for supplying power.

Still other embodiments of the inventive concepts provide a method of fabricating a semiconductor device having a MOSFET operable at a low voltage.

In an aspect of the inventive concepts, a semiconductor device, comprises: a channel layer on a substrate; cell trench patterns in the channel layer; and a source pattern on the cell trench patterns, wherein the source pattern includes: grooves, each having inclined sidewalls and bottom that extends in a horizontal direction in a portion of the channel layer between the cell trench patterns, source regions at the inclined sidewalls of the grooves, source isolation regions at the bottoms of the grooves, and a source electrode at interior regions of the grooves and that has a planar upper surface.

In some embodiments, each of the cell trench patterns includes a cell shield pattern at a lower region of a cell trench, a cell gate pattern at a middle region of the cell trench; and a cell capping pattern at an upper region of the cell trench; and the cell capping pattern has a same vertical position as the grooves.

In some embodiments, the cell shield pattern includes a cell shield insulating layer at an inner wall of the cell trench, and a cell shield electrode on the cell shield insulating layer that fills the lower region of the cell trench; and an upper end of the cell shield electrode protrudes so as to be at a higher vertical position than an upper end of the cell shield insulating layer.

In some embodiments, the cell gate pattern includes a cell gate insulating layer at the inner wall of the cell trench and on the cell shield electrode, and a cell gate electrode on the cell gate insulating layer that fills the middle region of the cell trench; and a portion of a lower surface of the cell gate electrode is recessed.

In some embodiments, the cell trench includes a discontinuous portion in which a width thereof is reduced between the lower region and the middle region; the cell shield electrode has a first horizontal width; and the cell gate electrode has a second horizontal width that is greater than the first horizontal width.

In some embodiments, the cell gate insulating layer is further positioned at an inner wall of the upper region of the cell trench; the cell capping pattern includes a cell capping stopper layer on the cell gate insulating layer, and a cell capping layer on the cell capping insulating layer that fills the upper region of the cell trench; and an upper end of the cell capping stopper layer is at a same vertical position as an upper end of the cell capping layer.

In some embodiments, each of the cell trench patterns further comprises a cell buffer layer between the cell gate electrode and the cell capping stopper layer; the cell capping stopper layer comprises silicon nitride; the cell capping layer and the cell buffer layer comprise silicon oxide; and the cell gate insulating layer comprises oxidized silicon. In some embodiments, the semiconductor device further comprises dummy trench patterns neighboring a portion of the cell trench patterns, and an interlayer insulating layer on the dummy trench patterns, wherein an upper surface of the source electrode is at a same vertical position as an upper surface of the interlayer insulating layer.

In some embodiments, each of the dummy trench patterns includes: a dummy trench wider and deeper than the cell trench; a dummy shield pattern at a lower region of the dummy trench; a dummy gate pattern at a middle region of the dummy trench; and a dummy capping pattern at an upper region of the dummy trench.

In some embodiments, the semiconductor device further comprises a gate pickup trench pattern spaced apart from the cell trench patterns, wherein the gate pickup trench pattern includes a gate pickup trench wider and deeper than the cell trench, a gate pickup shield pattern at a lower region of the gate pickup trench, and a gate pickup pattern at an upper region of the gate pickup trench, wherein the gate pickup pattern includes a gate pickup insulating layer on an upper portion of the gate pickup shield pattern and an inner wall of the gate pickup trench, and a gate pickup electrode on the gate pickup insulating layer that fills the upper region of the gate pickup trench, and wherein a portion of the gate pickup insulating layer is at a same vertical position as an upper surface of the gate pickup electrode.

In some embodiments, the semiconductor device further comprises a shield pickup trench pattern spaced apart from the cell trench patterns, wherein the shield pickup trench pattern includes a shield pickup trench wider and deeper than the cell trench, and a shield pickup pattern at a lower region of the shield pickup trench, the shield pickup pattern includes a shield pickup insulating layer on an inner wall of the shield pickup trench, and a shield pickup electrode on the shield pickup insulating layer that fills the shield pickup trench, and wherein a portion of an upper surface of the shield pickup insulating layer is at a same vertical position as an upper surface of the shield pickup electrode.

In another aspect of the inventive concepts, a semiconductor device comprises: a channel layer on a substrate; cell trench patterns and dummy trench patterns in the channel layer, each of the cell trench patterns including a cell shield pattern at a lower region of a cell trench, a cell gate pattern at a middle region of the cell trench, and a cell capping pattern at an upper region of the cell trench, and each of the dummy trench patterns including a dummy trench wider and deeper than the cell trench, a dummy shield pattern at a lower region of the dummy trench, a dummy gate pattern at a middle region of the dummy trench, and a dummy capping pattern at an upper region of the dummy trench; a source electrode on the cell trench patterns; and an interlayer insulating layer on the dummy trench patterns, wherein an upper surface of the source electrode at a same vertical position as an upper surface of the interlayer insulating layer.

In some embodiments, the semiconductor device further comprises dummy trench patterns neighboring a portion of the cell trench patterns, and an interlayer insulating layer on the dummy trench patterns, wherein an upper surface of the source electrode is at a same vertical position as an upper surface of the interlayer insulating layer, and wherein each of the dummy trench patterns includes a dummy trench wider and deeper than the cell trench, a dummy shield pattern at a lower region of the dummy trench, a dummy gate pattern at a middle region of the dummy trench, and a dummy capping pattern at an upper region of the dummy trench.

In some embodiments, the semiconductor device further comprises a gate pickup trench pattern in the channel layer, wherein the gate pickup trench pattern includes a gate pickup trench wider and deeper than the cell trench, a gate pickup shield pattern at a lower region of the gate pickup trench, and a gate pickup pattern at an upper region of the gate pickup trench, and an upper surface of the dummy capping pattern is at a same vertical position as an upper surface of the gate pickup pattern.

In some embodiments, the semiconductor device further comprises a shield pickup trench pattern in the channel layer, wherein the shield pickup trench pattern includes a shield pickup trench wider and deeper than the cell trench, a shield pickup pattern being positioned in the shield pickup trench, and wherein the upper surface of the dummy capping pattern is at a same vertical position as an upper surface of the shield pickup pattern.

In another aspect, a semiconductor device comprises: a plurality of cell trenches in a channel layer; cell gates in the cell trenches; a groove in the channel layer between neighboring ones of the cell trenches, the groove having a first width at an upper portion thereof and a second width at a lower portion thereof, the first width being greater than the second width; a source electrode in the groove; source regions at opposed sidewalls of the channel layer between the source electrode and the cell trenches, the source regions having a first width at an upper portion thereof and a second width at a lower portion thereof, the second width being greater than the first width; and a source isolation region at a bottom of the groove below the source electrode and between the source regions.

In some embodiments, the source regions include impurities of a first type that are implanted into the sidewalls of the channel layers exposed by the grooves.

In some embodiments, the source isolation region includes impurities of a second type that are implanted into the bottom of the grooves.

In some embodiments, the source electrode is positioned in multiple grooves.

In some embodiments, the source electrode has a planar upper surface.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF EMBODIMENTS

Figure 1A:
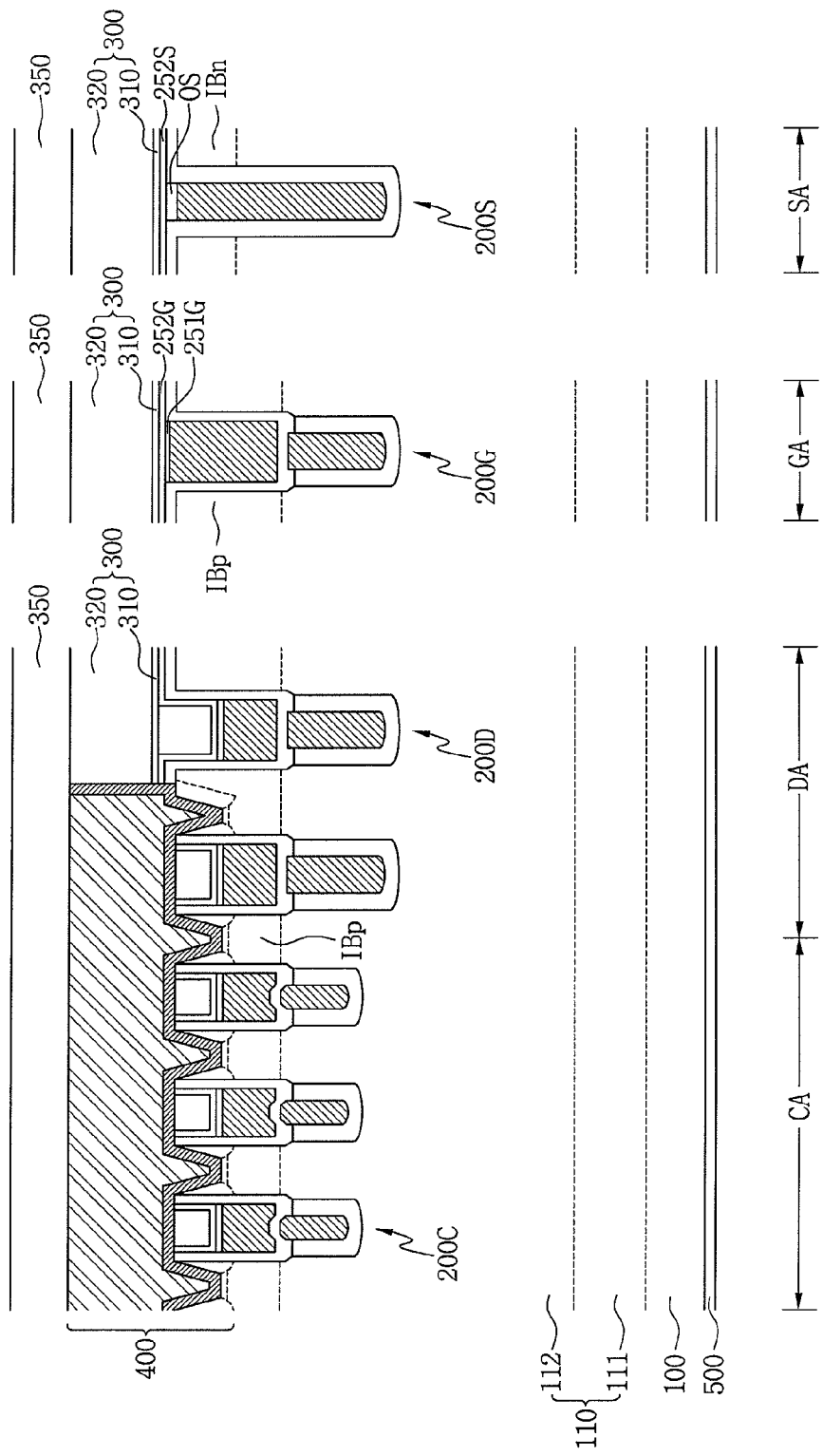
FIGS. 1A and 2A are longitudinal sectional views for describing semiconductor devices in accordance with embodiments of the inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

FIG. 1A is a longitudinal sectional view for describing a semiconductor device in accordance with an embodiment of the inventive concept. FIGS. 1B to 1E are partial enlarged views of FIG. 1A. Referring to FIGS. 1A to 1E, a semiconductor device 10A according to an embodiment of the inventive concept may include a substrate 100, a channel layer 110 disposed on the substrate 100, trench patterns 200C, 200D, 200G, and 200S disposed in the channel layer 110, a source pattern 400, and a drain electrode 500.

In some embodiments, the substrate 100 may comprise a silicon wafer containing single crystal silicon. In some embodiments, the substrate 100 may include phosphorous (P) having a concentration of about $1E20/cm^3$. In various applications, the substrate 100 may be allocated into a cell area CA, a dummy area DA, a gate pickup area GA, and a shield pickup area SA. The cell area CA and the dummy area DA may be disposed so as to be adjacent to each other. The gate pickup area GA and the shield pickup area SA may be spaced apart from each other, i.e. disposed so that they are isolated from each other.

The channel layer 110 may include a lower channel layer 111 and an upper channel layer 112. In some embodiments, the lower channel layer 111 may comprise a single crystal silicon layer containing arsenic (As) having a concentration of about $1E19/cm^3$. In some embodiments, the upper channel layer 112 may comprise a single crystal silicon layer containing phosphorous (P) having a concentration of about $1E17/cm^3$. In various embodiments, other materials, other crystalline orientations or properties and other concentrations may be employed, depending on the desired application.

The trench patterns 200C, 200D, 200G, and 200S may include cell trench patterns 200C, dummy trench patterns 200D, a gate pickup trench pattern 200G, and a shield pickup trench pattern 200S.

Figure 1B:
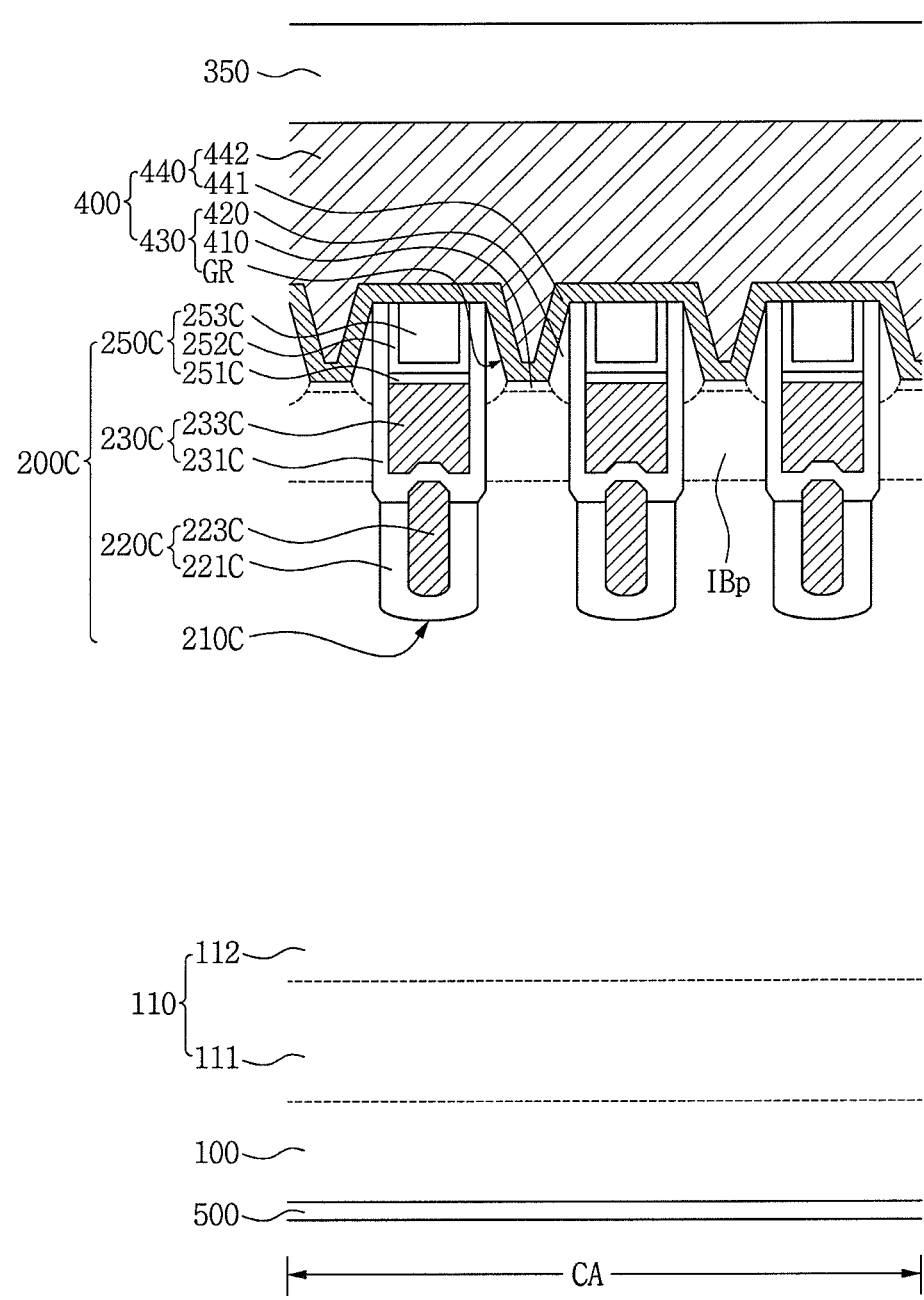
FIGS. 1B to 1E and FIGS. 2B and 2C are partial enlarged views of FIGS. 1A and 2A.
Figure 1C:
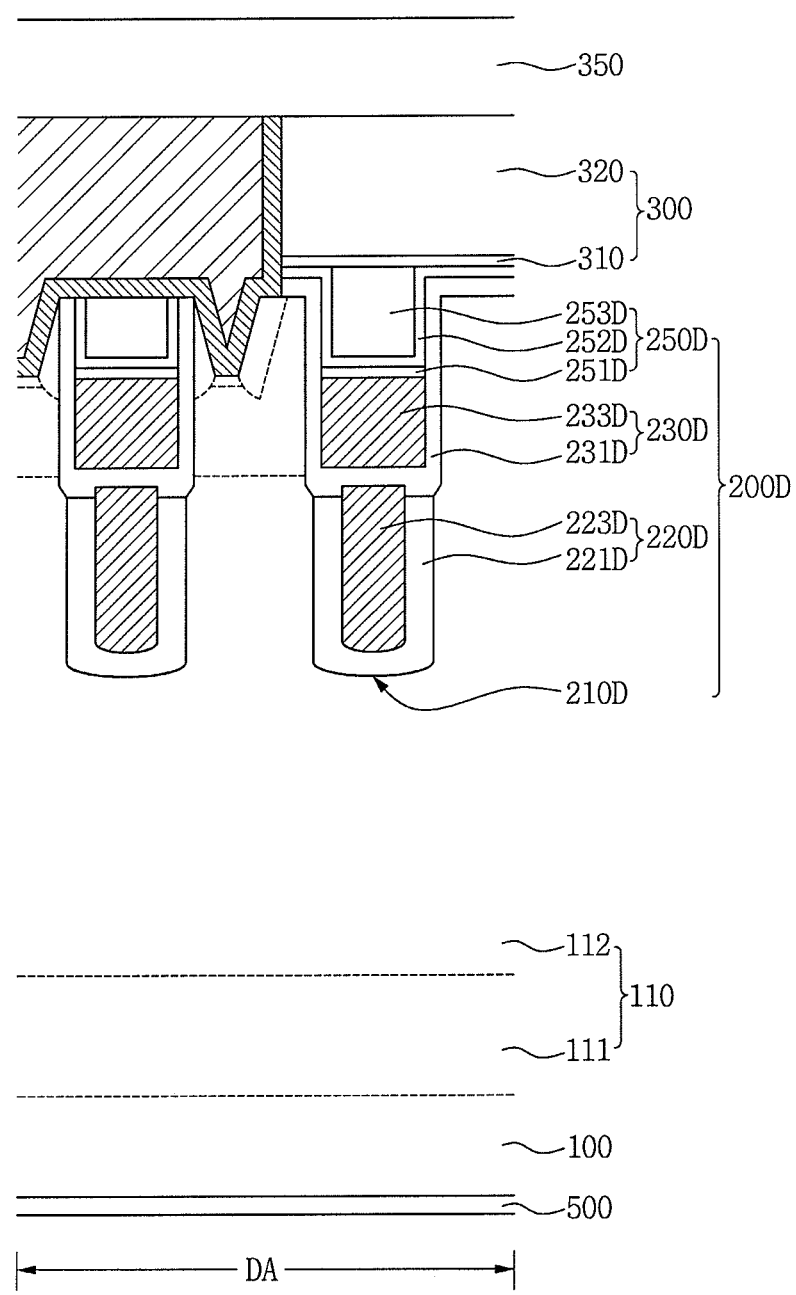

Referring generally to FIG. 1B, each cell trench pattern 200C may include a cell shield pattern 220C formed on a lower region of a cell trench 210C, a cell gate pattern 230C formed on an intermediate region of the cell trench 210C, and a cell capping pattern 250C formed on an upper region of the cell trench 210C.

The cell shield pattern 220C may include a cell shield insulating layer 221C and a cell shield electrode 223C. The cell shield insulating layer 221C may be conformally formed on an inner wall of the cell trench 210C. In some embodiments, the cell shield insulating layer 221C may comprise silicon oxide. In some embodiments, the cell shield electrode 223C may include a conductive material such as doped polycrystalline silicon. An upper end of the cell shield electrode 223C may protrude in a vertical direction so as to be higher than that of the cell shield insulating layer 221C. The upper end of the cell shield electrode 223C may be configured so that lateral portions thereof are inclined, and thus a central portion thereof protrudes in a vertical direction relative to side portions thereof.

The cell gate pattern 230C may include a cell gate insulating layer 231C and a cell gate electrode 233C. The cell gate insulating layer 231C may be conformally formed on an upper surface of the cell shield pattern 220C and inner walls of the intermediate and upper regions of the cell trench 210C. In some embodiments, the cell gate insulating layer 231C may include oxidized silicon. In some embodiments, the cell gate electrode 233C may include a conductive material such as doped polycrystalline silicon. The cell gate insulating layer 231C may completely enclose lower and lateral surfaces of the cell gate electrode 233C. The cell gate insulating layer 231C may have a profile in which a lower surface thereof is recessed upward or protrudes downward so as to follow a profile of the protruding or recessed upper end of the cell shield electrode 223C. The lower surface of the cell gate electrode 233C may be recessed upward so as to follow the profile of the protruding upper end of the cell shield electrode 223C. The cell gate insulating layer 231C may be used as an inter-electrode insulating layer between the cell gate electrode 233C and the cell shield electrode 223C. The cell gate insulating layer 231C may be formed to have a thickness that is less than that of the cell shield insulating layer 221C.

The cell capping pattern 250C may include a cell buffer layer 251C, a cell capping stopper layer 252C, and a cell capping layer 253C. The cell buffer layer 251C may be formed on an upper surface of the cell gate electrode 233C. In some embodiments, the cell buffer layer 251C may include oxidized silicon. The cell capping stopper layer 252C may be conformally formed on an upper surface of the cell buffer layer 251C and on sidewalls of the cell gate insulating layer 231C. In some embodiments, the cell capping stopper layer 252C may include silicon nitride. The cell capping layer 253C may include silicon oxide. The cell capping stopper layer 252C may enclose lower and lateral surfaces of the cell capping layer 253C. In some embodiments, upper surfaces of the cell gate insulating layer 231C, the cell capping stopper layer 252C, and the cell capping layer 253C may be flush with one another.

Referring generally to FIG. 1B, each dummy trench pattern 200D may include a dummy shield pattern 220D formed on a lower region of a dummy trench 210D, a dummy gate pattern 230D formed on a middle region of the dummy trench 210D, and a dummy capping pattern 250D formed on an upper region of the dummy trench 210D.

The dummy shield pattern 220D may include a dummy shield insulating layer 221D and a dummy shield electrode 223D. The dummy shield insulating layer 221D may be conformally formed on an inner wall of the dummy trench 210D. In some embodiments, the dummy shield insulating layer 221D may include silicon oxide. In some embodiments, the dummy shield electrode 223D may comprise a conductive material such as doped polycrystalline silicon.

The dummy gate pattern 230D may include a dummy gate insulating layer 231D and a dummy gate electrode 233D. The dummy gate insulating layer 231D may be conformally formed on an upper surface of the dummy shield pattern 220D and on an inner wall of the dummy trench 210D. In some embodiments, the dummy gate insulating layer 231D may include oxidized silicon. In some embodiments, the dummy gate electrode 233D may include a conductive material such as doped polycrystalline silicon. The dummy gate insulating layer 231D may completely enclose lower and lateral surfaces of the dummy gate electrode 233D. The dummy gate insulating layer 231D may be used as an inter-electrode insulating layer between the dummy gate electrode 233D and the dummy shield electrode 223D. The dummy gate insulating layer 231D may be formed so as to have a thickness that is less than that of the dummy shield insulating layer 221D.

The dummy capping pattern 250D may include a dummy buffer layer 251D, a dummy capping stopper layer 252D, and a dummy capping layer 253D. The dummy buffer layer 251D may be formed on an upper surface of the dummy gate electrode 233D. The dummy buffer layer 251D may include oxidized silicon. The dummy capping stopper layer 252D may be conformally formed on an upper surface of the dummy buffer layer 251D and on sidewalls of the dummy gate insulating layer 231D. In some embodiments, the dummy capping stopper layer 252D may include silicon nitride. In some embodiments, the dummy capping layer 253D may include silicon oxide. The dummy capping stopper layer 252D may enclose lower and lateral surfaces of the dummy capping layer 253D. In some embodiments, upper surfaces of the dummy capping stopper layer 252D and the dummy capping layer 253D may be flush with each other.

Figure 1D:
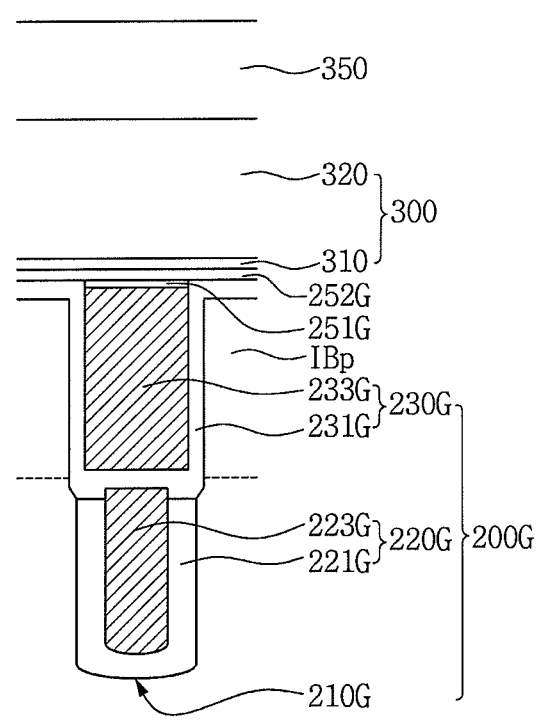
Figure 1D:
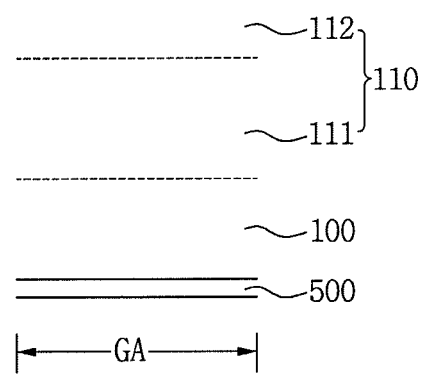

Referring generally to FIG. 1D, the gate pickup trench pattern 200G may include a gate pickup shield pattern 220G formed in a lower region of a gate pickup trench 210G, and a gate pickup pattern 230G formed in an upper region of the gate pickup trench 210G.

The gate pickup shield pattern 220G may include a gate pickup shield insulating layer 221G and a gate pickup shield electrode 223G. The gate pickup shield insulating layer 221G may be conformally formed on a lower surface and an inner wall of the gate pickup trench 210G. The gate pickup shield insulating layer 221G may include silicon oxide. The gate pickup shield electrode 223G may include a conductor such as doped polycrystalline silicon. An upper end of the gate pickup shield electrode 223G may be flush with or higher than an upper end of the gate pickup shield insulating layer 221G.

The gate pickup pattern 230G may include a gate pickup insulating layer 231G and a gate pickup electrode 233G. The gate pickup insulating layer 231G may be conformally formed on an upper surface of the gate pickup shield electrode 223G and on the inner wall of the gate pickup trench 210G. In some embodiments, the gate pickup insulating layer 231G may include oxidized silicon. In some embodiments, the gate pickup electrode 233G may include a conductive material such as doped polycrystalline silicon. The gate pickup insulating layer 231G may completely enclose lower and lateral surfaces of the gate pickup electrode 233G. The gate pickup insulating layer 231G may be used as an inter-electrode insulating layer between the gate pickup electrode 233G and the gate pickup shield electrode 223G. The gate pickup trench pattern 200G may further include a gate pickup buffer layer 251G formed on the gate pickup electrode 233G. The gate pickup trench pattern 200G may further include a gate pickup capping stopper layer 252G that is formed flat in a horizontal direction on the gate pickup buffer layer 251G and the gate pickup insulating layer 231G. In some embodiments, the gate pickup insulating layer 231G may be formed so as to have a thickness that is less than that of the gate pickup shield insulating layer 221G.

Figure 1E:
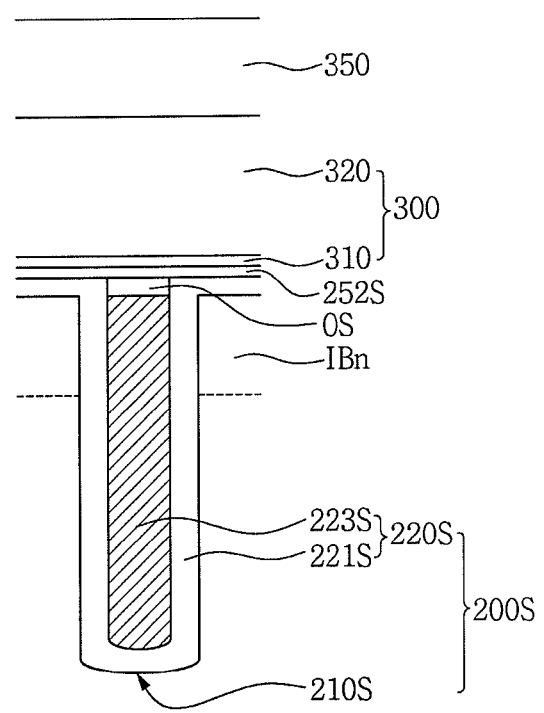
Figure 1E:
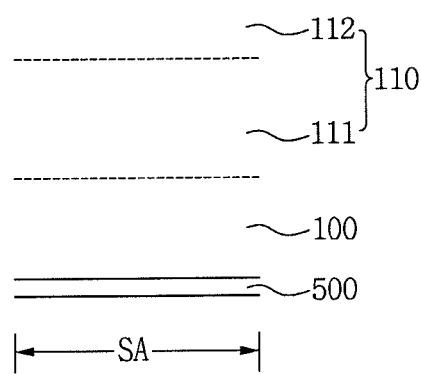

Referring generally to FIG. 1E, the shield pickup trench pattern 200S may include a shield pickup pattern 220S formed in a shield pickup trench 210S. The shield pickup pattern 220S may include a shield pickup insulating layer 221S and a shield pickup electrode 223S. The shield pickup insulating layer 221S may be conformally formed on a lower surface and an inner wall of the shield pickup trench 210S. In some embodiments, the shield pickup insulating layer 221S may include silicon oxide. The shield pickup electrode 223S may be formed on the shield pickup insulating layer 221S so as to fill the shield pickup trench 210S. In some embodiments, the shield pickup electrode 223S may include a conductor such as doped polycrystalline silicon. In some embodiments, the shield pickup trench pattern 200S may further include an oxidized silicon layer OS formed on the shield pickup electrode 223S.

Referring back to FIG. 1A, impurity bodies IBp and IBn may be formed in the upper channel layer 112. In some embodiments, the impurity bodies IBp and IBn may include p-type impurity bodies IBp formed in the cell area CA, the dummy area DA, and the gate pickup area GA, and an n-type impurity body IBn formed in the shield pickup area SA. In some embodiments, the p-type impurity bodies IBp may have a concentration of about $1E16/cm^3$ to $1E18/cm^3$. In some embodiments, the n-type impurity body IBn may have a concentration that is about ten times as high as that of the p-type impurity bodies IBp.

The source pattern 400 may be formed in the cell area CA. Referring back to FIG. 1B, the source pattern 400 may include source contact regions 430 and a source electrode. The source contact regions 430 may be formed in the p-type impurity bodies IBp in the cell area CA. The source contact regions 430 may include grooves GR having inclined lateral surfaces, source isolation regions 410 under lower surfaces of the grooves GR, and source regions 420 under the lateral surfaces of the grooves GR. The lower surfaces of the grooves GR may be horizontal so as to be parallel with a surface of the substrate 100. In some embodiments, the source isolation region 410 may have a concentration of about $1E18/cm^3$ to $1E20/cm^3$. In some embodiments, each source region 420 may have a concentration that is about ten times as high as that of each source isolation region 410.

The source electrode 440 may be formed on the cell trench patterns 200C and the source contact regions 430 of the cell area CA. The source electrode 440 may include a source barrier metal layer 441 and a source electrode metal layer 442. The source barrier metal layer 441 may be conformally formed on upper surfaces of the cell trench patterns 200C and on the lower and lateral surfaces of the grooves GR. In some embodiments, the source barrier metal layer 441 may include at least one of Ti, TiN, Ta, TaN, TiW, WN, and other barrier metals. In some embodiments, the source electrode metal layer 442 may include a metal such as tungsten (W) or a metal alloy. The source electrode 440 may be formed on a part of the dummy trench patterns 200D of the dummy area DA.

Returning to FIG. 1A, an interlayer insulating layer 300 may be formed on the gate pickup pattern 230G of the gate pickup area GA and the shield pickup pattern 220S of the shield pickup area SA. The interlayer insulating layer 300 may include a lower interlayer insulating layer 310 and an upper interlayer insulating layer 320. In some embodiments, the lower interlayer insulating layer 310 may include silicon nitride, and the upper interlayer insulating layer 320 may include silicon oxide. The interlayer insulating layer 300 may optionally also be formed on a part of the dummy trench patterns 200D of the dummy area DA.

Returning to FIG. 1C, a shield capping stopper layer 252S may be interposed between the shield pickup pattern 220S and interlayer insulating layer 300 of the shield pickup area SA so as to extend in a horizontal direction as shown.

Returning to FIG. 1A, a passivation layer 350 may be formed on the source pattern 400 and the interlayer insulating layer 300. In some embodiments, the passivation layer 350 may include an insulator such as silicon oxide, silicon nitride, or polyimide.

The semiconductor device 10A in accordance with embodiments of the inventive concepts may have the cell shield patterns 220C having a relatively narrow horizontal width, and the cell gate patterns 230C having a relatively wide horizontal width. Each cell gate insulating layer 231C may include oxidized silicon having excellent electrical, physical, and mechanical properties. Accordingly, the semiconductor device 10A according to the embodiment of the inventive concept can perform an excellent switching operation.

The semiconductor device 10A in accordance with embodiments of the inventive concepts may have a grooved contact structure. Accordingly, the resulting contact area of the source region 420 with the source electrode 440 is increased, and therefore, contact resistance can be reduced.

The semiconductor device 10A in accordance with embodiments of the inventive concepts may include source regions 420 that are inclinedly implanted into lower portions of the inclined lateral surfaces of the grooves GR, and further may include source isolation regions 410 of lower portions of the grooves GR. Accordingly, an electrical short-circuit phenomenon between the source regions 420 can be reliably prevented.

The semiconductor device 10A in accordance with embodiments of the inventive concepts may include the cell shield electrodes 223C electrically connected with the source electrode 440. Accordingly, power efficiency can be improved.

Figure 2A:
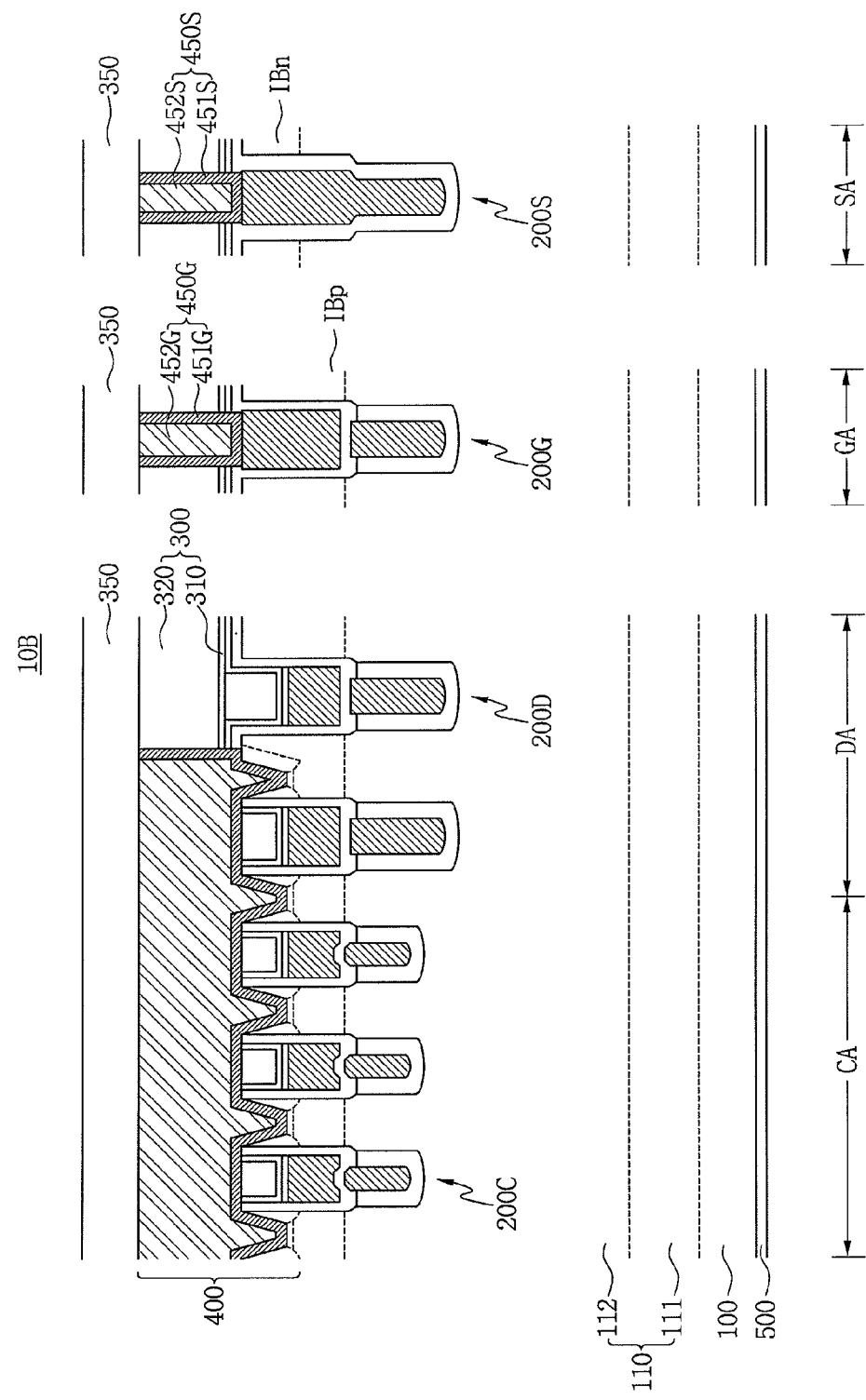
Figure 2B:
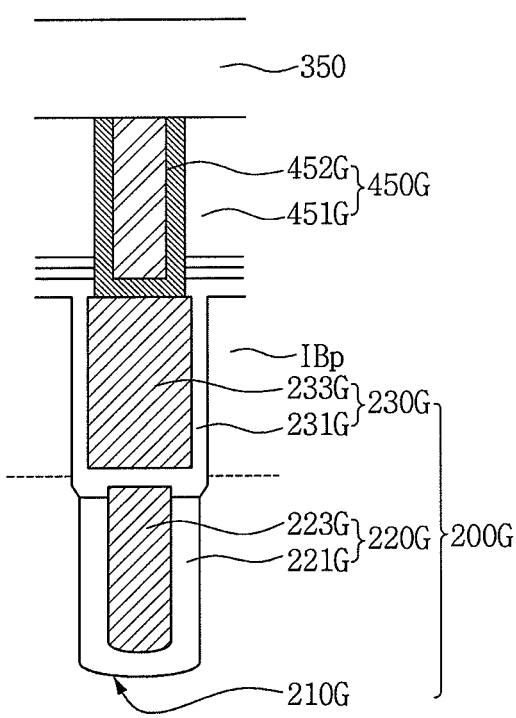
Figure 2B:
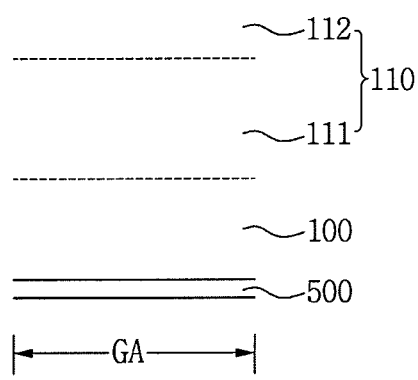
Figure 2C:
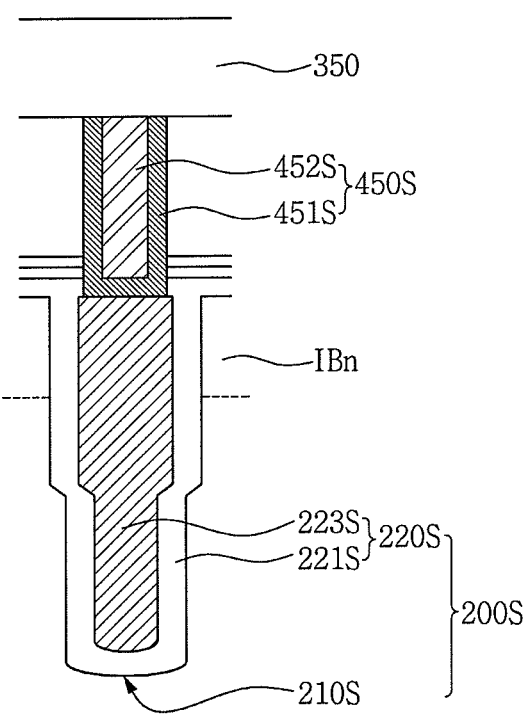
Figure 2C:
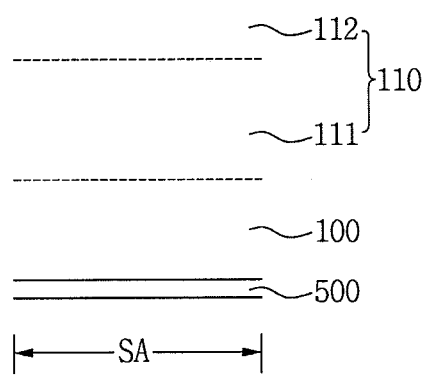

FIG. 2A is a longitudinal sectional view of a semiconductor device according to another embodiment of the inventive concepts, and FIGS. 2B and 2C are partial enlarged views of FIG. 2A.

Referring to FIGS. 2A to 2C, a semiconductor device 10B according to another embodiment of the inventive concepts may include a substrate 100, a channel layer 110 formed on the substrate 100, trench patterns 200C, 200D, 200G, and 200S, a source pattern 400, and pickup patterns 450G and 450S formed in the channel layer 110, and a drain electrode 500. Referring to FIG. 2B, the pickup patterns 450G and 450S may include a gate pickup pattern 450G and a shield pickup pattern 450S. The gate pickup pattern 450G may include a gate pickup barrier metal layer 451G and a gate pickup metal layer 452G. The gate pickup barrier metal layer 451G may enclose lower and lateral surfaces of the gate pickup metal layer 452G. The gate pickup pattern 450G may have a narrower horizontal width than a gate pickup electrode 233G.

The shield pickup pattern 450S may include a shield pickup barrier metal layer 451S and a shield pickup metal layer 452S. The shield pickup barrier metal layer 451S may enclose lower and lateral surfaces of the shield pickup metal layer 452S. The shield pickup pattern 450S may have a narrower horizontal width than the gate pickup shield electrode 223G. In some embodiments, the gate pickup barrier metal layer 451G and the shield pickup barrier metal layer 451S may include at least one of Ti, TiN, Ta, TaN, TiW, WN, and other barrier metals. The gate pickup metal layer 452G and the shield pickup metal layer 452S may include a metal such as tungsten or a metal alloy. A shield pickup trench 210S may include a lower region having a relatively narrow width, and an upper region having a relatively wide width. Accordingly, a shield pickup electrode 223S may also include a lower region having a relatively narrow width and an upper region having a relatively wide width.

Referring to FIG. 2C, the gate pickup pattern 450G, the gate pickup electrode 233G, a cell gate electrode 233C, and a dummy gate electrode 233D may be electrically connected. The shield pickup pattern 450S, a shield pickup electrode 223S, a cell shield electrode 223C, and a dummy shield electrode 223D may be electrically connected. The gate pickup pattern 450G and the shield pickup pattern 450S may include a pad or wiring.

Figure 3A:
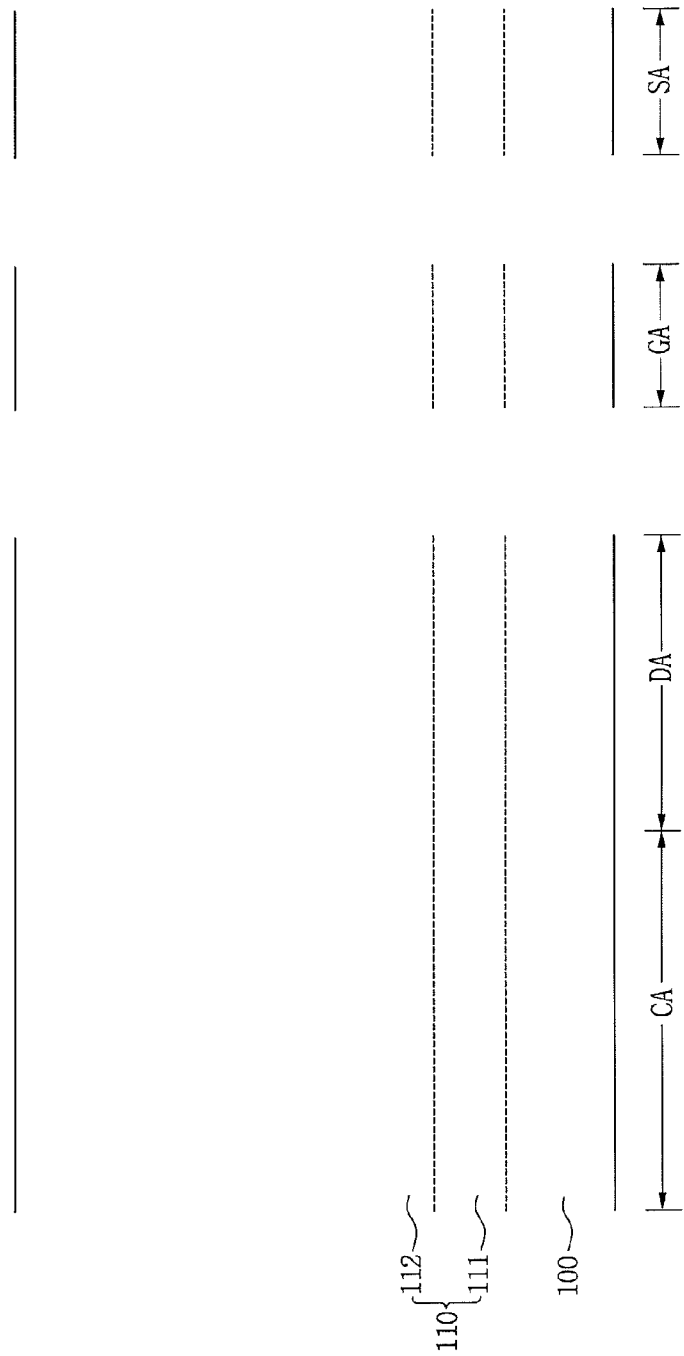
FIGS. 3A to 3V and 4A to 4C are views for describing a method of fabricating the semiconductor devices in accordance with embodiments of the inventive concept.

Referring to FIG. 3A, a method of fabricating the semiconductor device according to embodiments of the inventive concepts may include a process of forming a channel layer 110 on a substrate 100. The channel layer 110 may include a lower channel layer 111 and an upper channel layer 112. The substrate 100 and the channel layer 110 may include n-type impurities. For example, in some embodiments, the substrate 100 may comprise a single crystal silicon wafer including phosphorous (P) having a concentration of about $1E20/cm^3$. In some embodiments, the lower channel layer 111 and the upper channel layer 112 may be formed using an epitaxial growth process. For example, the lower channel layer 111 may be formed using an epitaxial growth process by feeding reaction gases including $SiH_4$ and As ions into a reaction chamber. In some embodiments, the upper channel layer 112 may be formed using the epitaxial growth process by feeding reaction gases including $SiH_4$ and P ions such as $POCl_4$ into a reaction chamber. In some embodiments, the substrate 100 may be allocated into a cell area CA, a dummy area DA, a gate pickup area GA, and a shield pickup area SA.

Figure 3B:
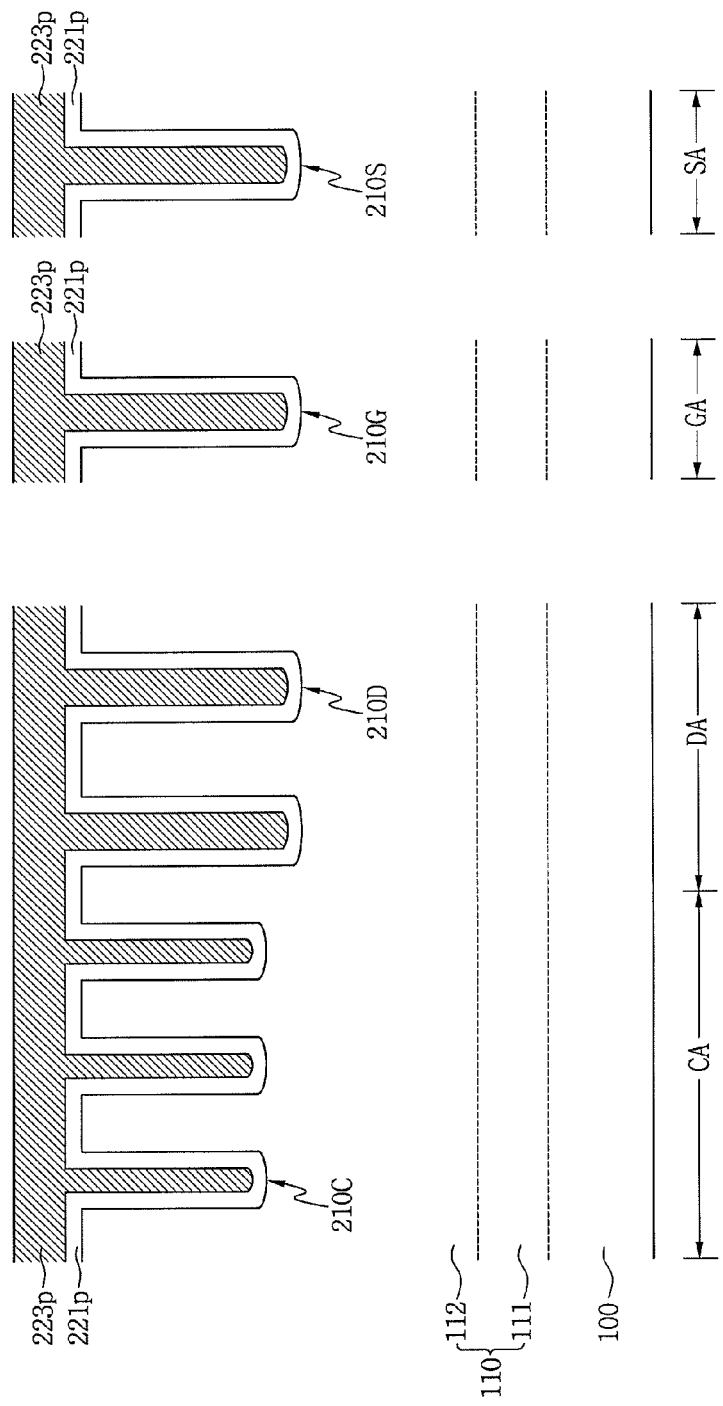

Referring to FIG. 3B, the method may include a process of forming trenches 210C, 210D, 210G, and 210S in the upper channel layer 112, a process of conformally forming a preliminary shield insulating layer 221p on inner walls of the trenches 210C, 210D, 210G, and 210S and on an upper surface of the upper channel layer 112, and a process of forming a preliminary shield electrode 223p on the preliminary shield insulating layer 221p so as to fill the trenches 210C, 210D, 210G, and 210S. The trenches 210C, 210D, 210G, and 210S may include cell trenches 210C in the cell area CA, dummy trenches 210D in the dummy area DA, a gate pickup trench 210G in the gate pickup area GA, and a shield pickup trench 210S in the shield pickup area SA. The dummy trenches 210D, the gate pickup trench 210G, and the shield pickup trench 210S may be formed so as to be deeper and wider than the cell trenches 210C. In some embodiments, the preliminary shield insulating layer 221p may include silicon oxide formed using an oxidation process, a sub-atmosphere chemical vapor deposition (CVD) process, or an atomic layer deposition (ALD) process. The preliminary shield electrode 223p may include polysilicon formed using a CVD process.

Figure 3C:
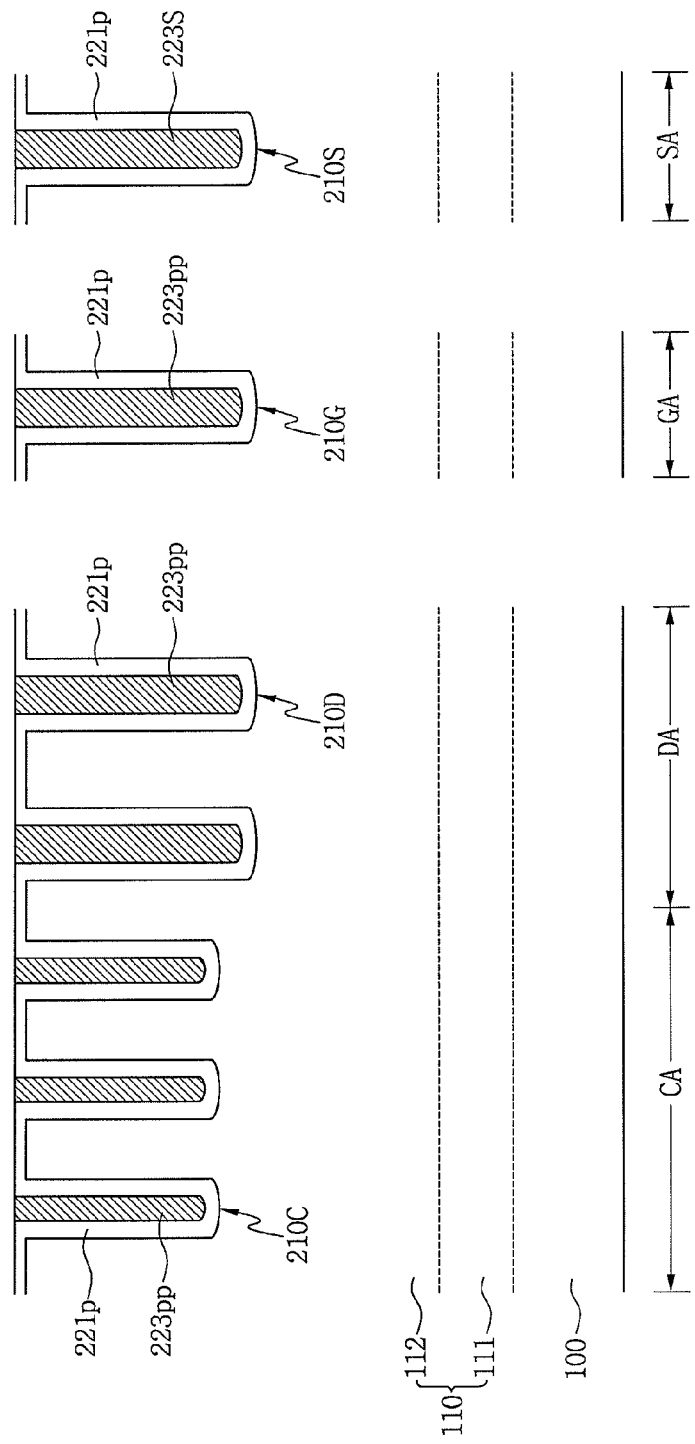

Referring to FIG. 3C, the method may include a process of planarizing the preliminary shield electrode 223p to form planarized preliminary shield electrodes 223pp and a planarized shield pickup electrode 223S, which remain only in the trenches 210C, 210D, 210G, and 210S. The planarized preliminary shield electrodes 223pp may fill the cell trenches 210C, the dummy trenches 210D, and the gate pickup trench 210G, and the planarized shield pickup electrode 223S may fill the shield pickup trench 210S. As a result of the planarization process, an upper surface of the preliminary shield insulating layer 221p on the upper channel layer 112 may be exposed. An upper surface of the shield pickup electrode 223S may be flush with or higher than the upper surface of the upper channel layer 112. Further, the upper surface of the shield pickup electrode 223S may be flush with the upper surface of the preliminary shield insulating layer 221p. In some embodiments, the planarization process may include a chemical mechanical polishing (CMP) process or an etch-back process, or other suitable process.

Figure 3D:
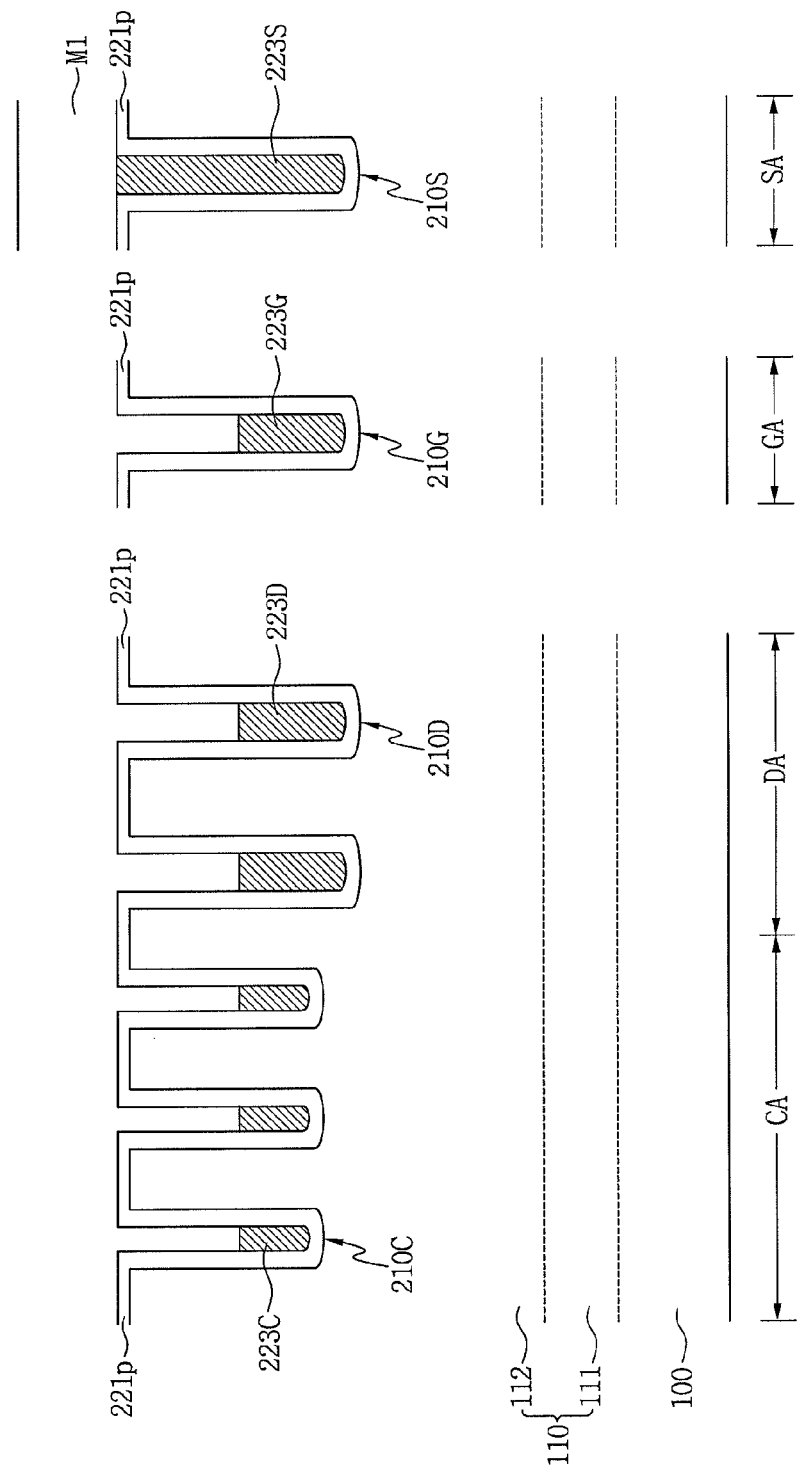

Referring to FIG. 3D, the method may include a process of forming a mask pattern M1 covering the shield pickup area SA, and a process of recessing the planarized preliminary shield electrodes 223pp to form shield electrodes 223C, 223D, and 223G. The shield electrodes 223C, 223D, and 223G may include cell shield electrodes 223C in the cell trenches 210C, dummy shield electrodes 223D in the dummy trenches 210D, and a gate pickup shield electrode 223G in the gate pickup trench 210G. Upper surfaces of the shield electrodes 223C, 223D, and 223G may be located in middle regions of the trenches 210C, 210D, and 210G, and the preliminary shield insulating layer 221p may be exposed to upper portions of the inner walls of the trenches 210C, 210D, and 210G. In some embodiments, the process of recessing the planarized preliminary shield electrodes 223pp may include an etch-back process. The mask pattern M1 may include a photoresist pattern.

Referring to FIG. 3E, the method may include a process of partly removing the preliminary shield insulating layer 221p exposed within the cell area CA, the dummy area DA, and the gate pickup area GA so as to be recessed using an etch-back process to form shield insulating layers 221C, 221D, and 221G. The shield insulating layers 221C, 221D, and 221G may include cell shield insulating layers 221C, dummy shield insulating layers 221D, and a gate pickup shield insulating layer 221G. The preliminary shield insulating layer 221p within the shield pickup area SA may be converted to a shield pickup insulating layer 221S extending to the surface of the upper channel layer 112. Upper surfaces of the shield insulating layers 221C, 221D, and 221G in the trenches 210C, 210D, and 210G may be positioned so as to be lower than those of the shield electrodes 223C, 223D, and 223G. That is, upper portions of the shield electrodes 223C, 223D, and 223G may protrude above upper regions of the remaining portions of the shield insulating layers 221C, 221D, and 221G. Afterwards, the mask pattern M1 may be removed. Cell shield patterns 220C, dummy shield patterns 220D, and a gate pickup shield pattern 220G, which include the shield insulating layers 221C, 221D, and 221G and the shield electrodes 223C, 223D, and 223G within the cell area CA, the dummy area DA, and the gate pickup area GA respectively, may be formed, and a shield pickup pattern 220S including the shield pickup insulating layer 221S and the shield pickup electrode 223S within the shield pickup area SA may be formed. The shield insulating layers 221C, 221D, and 221G may enclose lower and lateral surfaces of the shield electrodes 223C, 223D, and 223G, respectively. The shield pickup insulating layer 221S may enclose lower and lateral surfaces of the shield pickup electrode 223S.

Figure 3F:
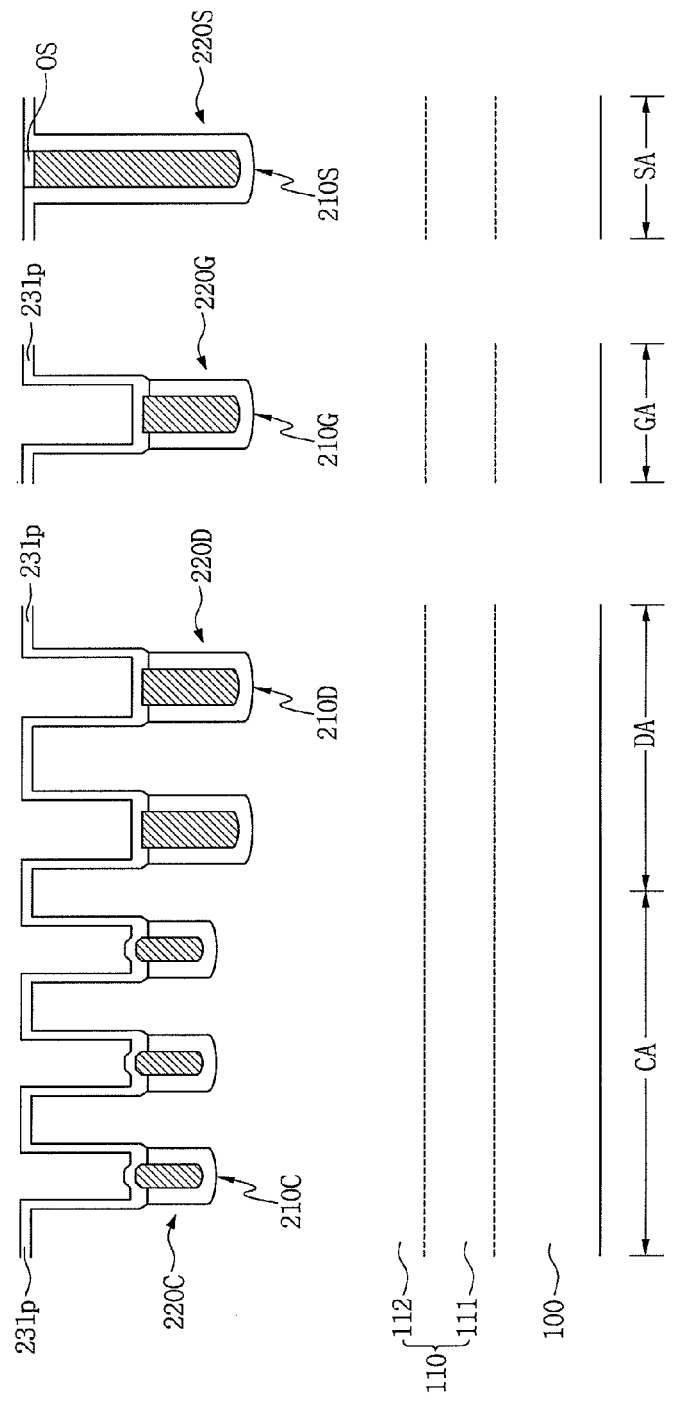

Referring to FIG. 3F, the method may include a process of forming a preliminary gate insulating layer 231p on the upper surfaces of the shield electrodes 223C, 223D, and 223G, the inner walls of the trenches 210C, 210D, and 210G, and the surface of the upper channel layer 112 within the cell area CA, the dummy area DA, and the gate pickup area GA. The process of forming the preliminary gate insulating layer 231p may include a process of oxidizing the upper surfaces of the recessed shield electrodes 223C, 223D, and 223G, the inner walls of the trenches 210C, 210D, and 210G, and the surface of the exposed upper channel layer 112. Accordingly, the preliminary gate insulating layer 231p may include an oxidized silicon layer. In this process, since the upper surfaces of the cell shield electrodes 223C are configured so that edges thereof are easily rapidly oxidized compared to central portions thereof, upper portions of the cell shield electrodes 223C may be deformed in a protruding shape. Since surfaces of the inner walls of the trenches 210C, 210D, and 210G are oxidized, the trenches 210C, 210D, and 210G may be widened. For example, the cell trenches 210C, the dummy trenches 210D, and the gate pickup trench 210G may include a lower region having a relatively narrow width, and an upper region having a relatively wide width. The inner walls of the cell trenches 210C, the dummy trenches 210D, and the gate pickup trench 210G may have a discontinuous portion in which a width is sharply changed. An oxidized silicon (OS) layer may be formed on an upper surface of the shield pickup pattern 220S of the shield pickup area SA.

Figure 3G:
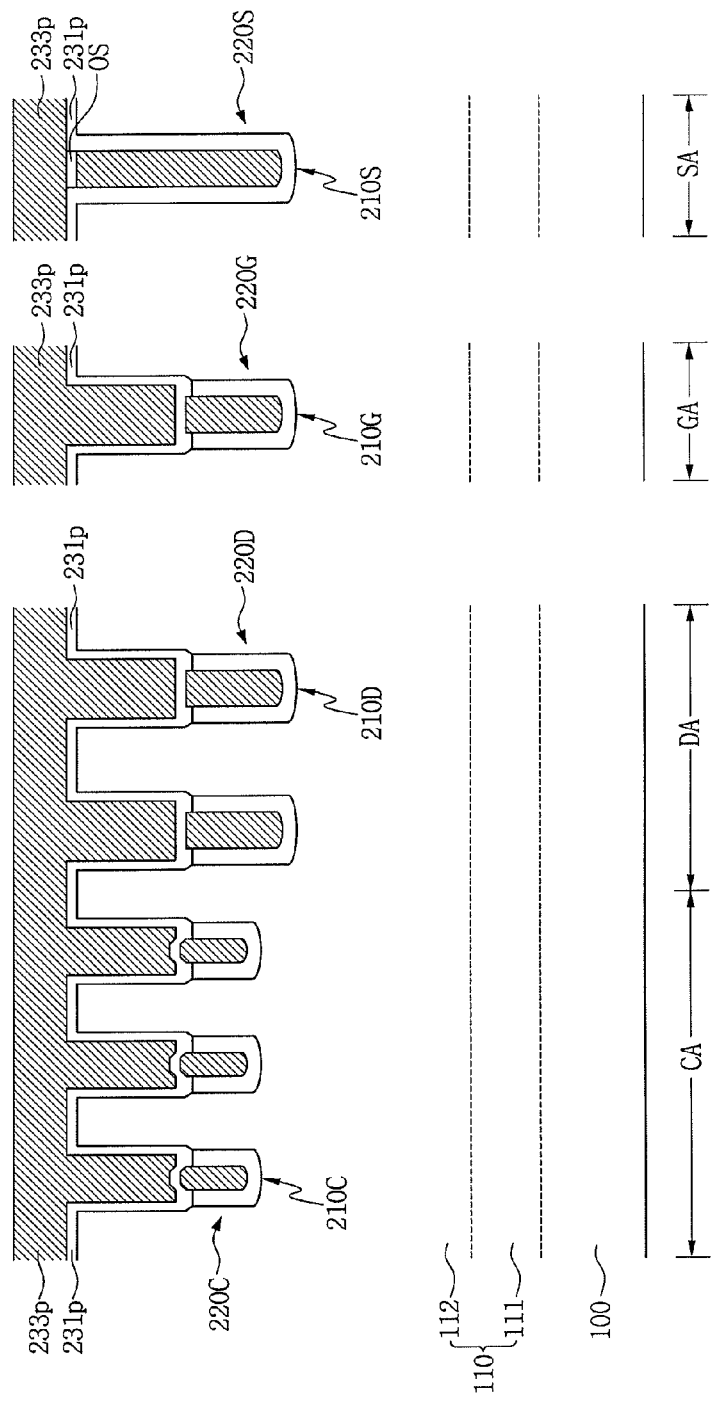

Referring to FIG. 3G, the method may include a process of forming a preliminary gate electrode 233p on the entire surface of the preliminary gate insulating layer 231p to fill the trenches 210C, 210D, and 210G. In some embodiments, the preliminary gate electrode 233p may include doped polycrystalline silicon formed by performing a CVD process.

Figure 3H:
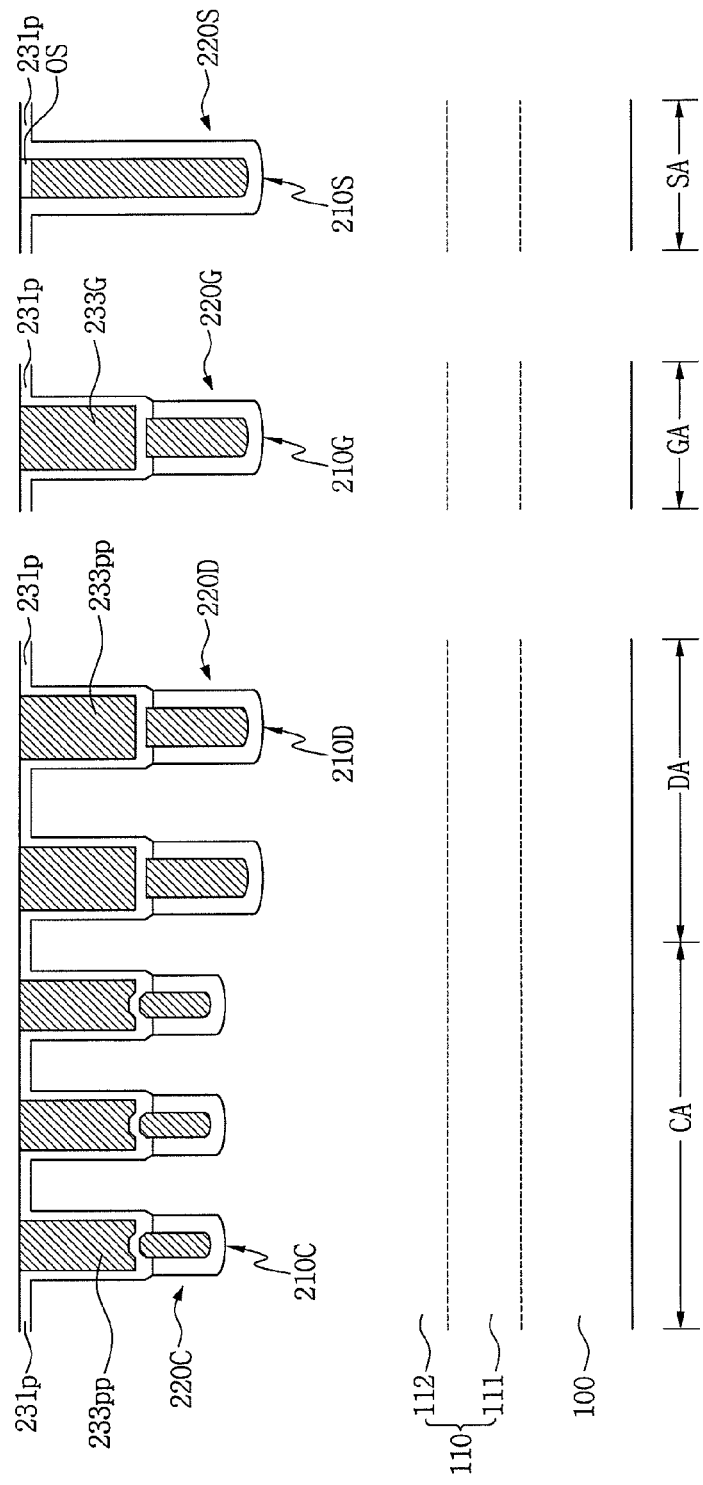

Referring to FIG. 3H, the method may include a process of planarizing the preliminary gate electrode 233p to leave planarized preliminary gate electrodes 233p in the cell trench 210C and the dummy trench 210D, and to form a gate pickup electrode 233G filling the gate pickup trench 210G. An upper surface of the preliminary gate insulating layer 231p on the upper channel layer 112 may be exposed. An upper surface of the gate pickup electrode 233G may be flush with or higher than the upper surface of the upper channel layer 112. Further, the upper surface of the gate pickup electrode 233G may be flush with the upper surface of the preliminary gate insulating layer 231p. In some embodiments, the planarization process may include a CMP process or an etch-back process.

Figure 3I:
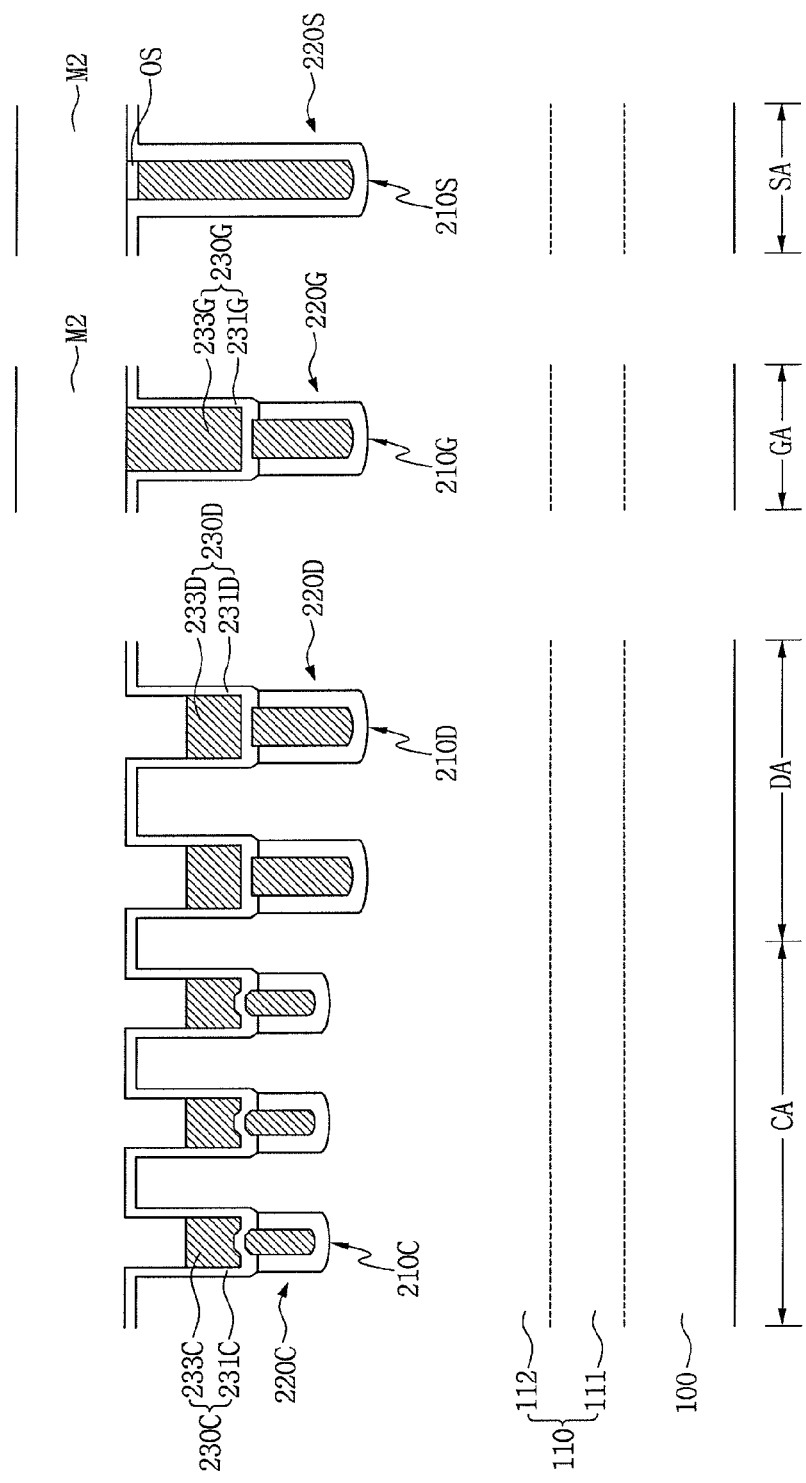

Referring to FIG. 3I, the method may include a process of forming a mask pattern M2 that exposes the cell area CA and the dummy area DA and covers the gate pickup area GA and the shield pickup area SA, and a process of recessing the planarized preliminary gate electrodes 233pp to form cell gate electrodes 233C and dummy gate electrodes 233D. Upper surfaces of the gate electrodes 233C and 233D may be located in the middles of the trenches 210C and 210D respectively, and the preliminary gate insulating layer 231p may be exposed to upper portions of the inner walls of the trenches 210C and 210D. In some embodiments, the process of recessing the planarized preliminary gate electrodes 233pp may include an etch-back process. The mask pattern M2 may include a photoresist pattern. Afterwards, the mask pattern M2 may be removed. In this process, each cell gate pattern 230C including a cell gate insulating layer 231C and a cell gate electrode 233C, each dummy gate pattern 230D including a dummy gate insulating layer 231D and a dummy gate electrode 233D, and a gate pickup pattern 230G including a gate pickup insulating layer 231G and a gate pickup electrode 233G, may be formed. The cell gate insulating layer 231C may enclose lower and lateral surfaces of the cell gate electrode 233C. The dummy gate insulating layer 231D may enclose lower and lateral surfaces of the dummy gate electrode 233D. The gate pickup insulating layer 231G may enclose lower and lateral surfaces of the gate pickup electrode 233G. The insulating layers 231C, 231D and 231G may cover all the inner walls of the trenches 210C, 210D, and 210G, and extend to the surface of the upper channel layer 112. For example, the insulating layers 231C, 231D and 231G may be physically continuous.

Figure 3J:
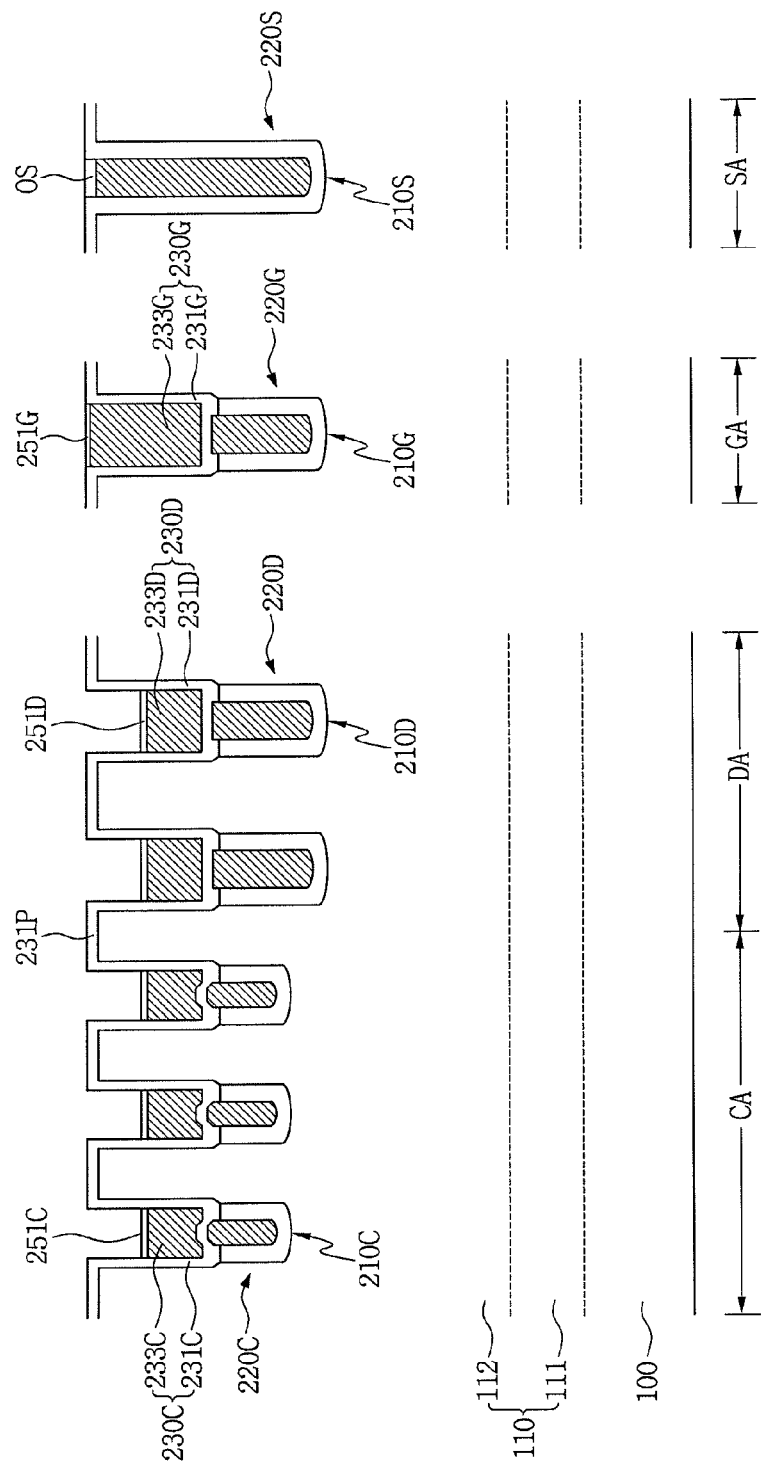

Referring to FIG. 3J, the method may include a process of forming buffer layers 251C, 251D, and 251G on the gate electrodes 233C and 233D and the gate pickup electrode 233G. In some embodiments, the buffer layers 251C, 251D, and 251G may be formed by oxidizing surfaces of the gate electrodes 233C and 233D and the gate pickup electrode 233G using an oxidation process. The buffer layers 251C, 251D, and 251G may include cell buffer layers 251C, dummy buffer layers 251D, and a gate pickup buffer layer 251G.

Figure 3K:
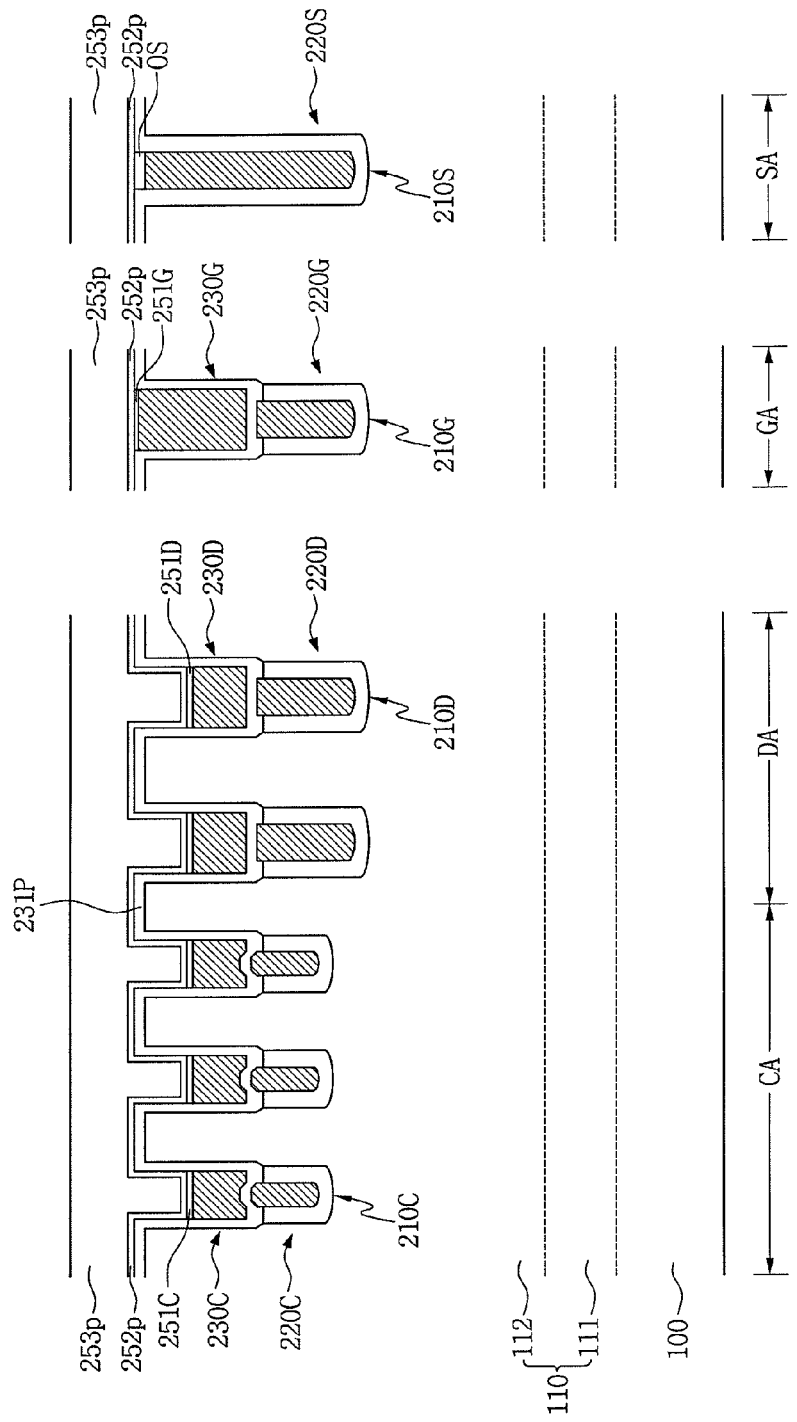

Referring to FIG. 3K, the method may include a process of forming a preliminary capping stopper layer 252p and a preliminary capping layer 253p on the underlying elements. In some embodiments, the preliminary capping stopper layer 252p may be conformally formed on upper surfaces of the buffer layers 251C, 251D, and 251G, inner walls of the cell trenches 210C and the dummy trenches 210D, and the preliminary gate insulating layer 231p formed on the upper channel layer 112. In some embodiments, the preliminary capping stopper layer 252p may comprise silicon nitride that is conformally formed by performing a CVD process. The preliminary capping layer 253p may be formed on the preliminary capping stopper layer 252p so as to fill the trenches 210C and 210D. In some embodiments, the preliminary capping layer 253p may include silicon oxide.

Figure 3L:
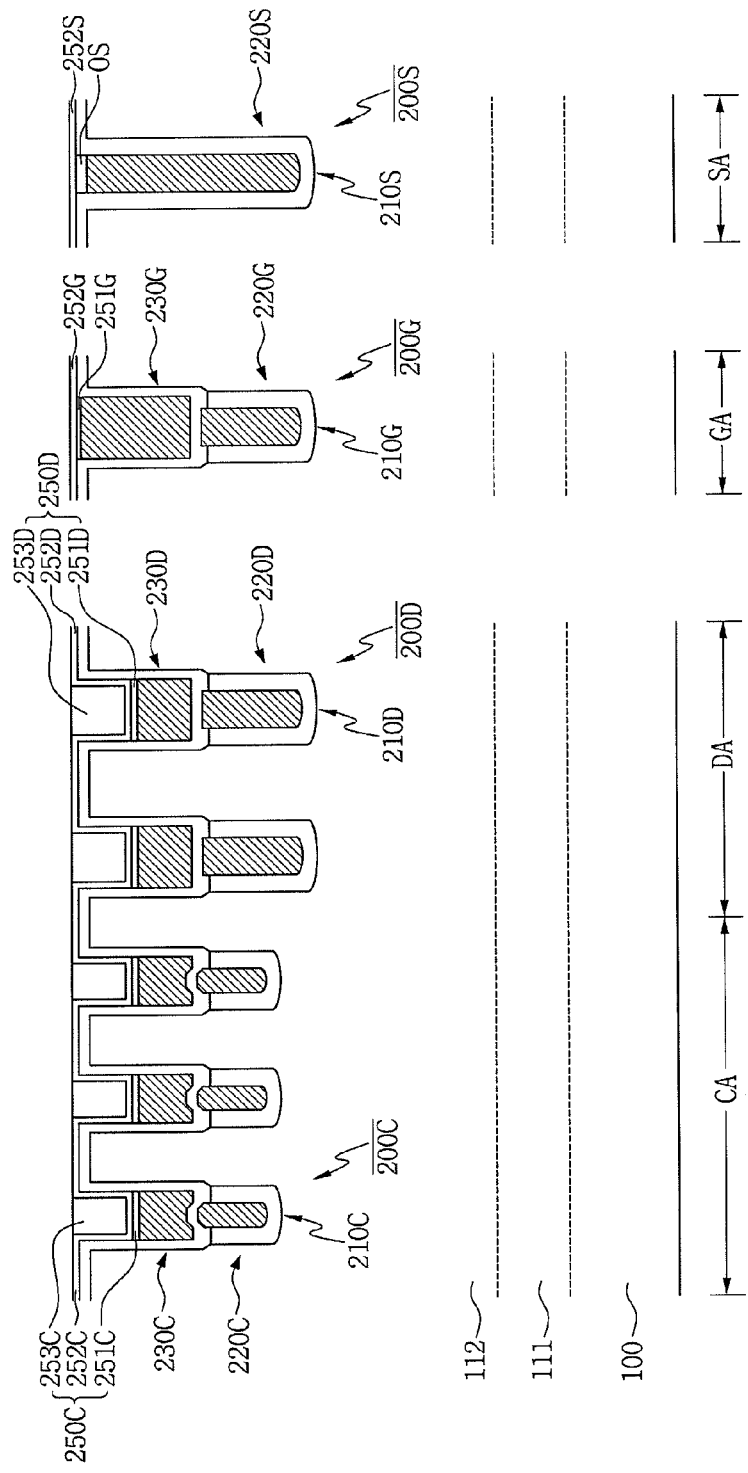

Referring to FIG. 3L, the method may include a process of planarizing the preliminary capping layer 253p to form capping layers 253C and 253D filling the trenches 210C and 210D. The preliminary capping stopper layer 252p may be exposed to the surface of the upper channel layer 112. The preliminary capping stopper layer 252p may be converted to cell capping stopper layers 252C, dummy capping stopper layers 252D, a gate pickup capping stopper layer 252G, and a shield pickup capping stopper layer 252S. Each cell capping pattern 250C including a cell buffer layer 251C, a cell capping stopper layer 252C, and a cell capping layer 253C, and each dummy capping pattern 250D including a dummy buffer layer 251D, a dummy capping stopper layer 252D, and a dummy capping layer 253D, may be formed. Thus, each cell trench pattern 200C including a cell shield pattern 220C, a cell gate pattern 230C, and a cell capping pattern 250C in the cell trench 210C, each dummy trench pattern 200D including a dummy shield pattern 220D, a dummy gate pattern 230D, and a dummy capping pattern 250D in the dummy trench 210D, a gate trench pattern 200G including a gate pickup shield pattern 220G and a gate pickup pattern 230G in the gate pickup trench 210G, and a shield trench pattern 200S including a shield pickup pattern 220S in the shield pickup trench 210S, may be formed.

Figure 3M:
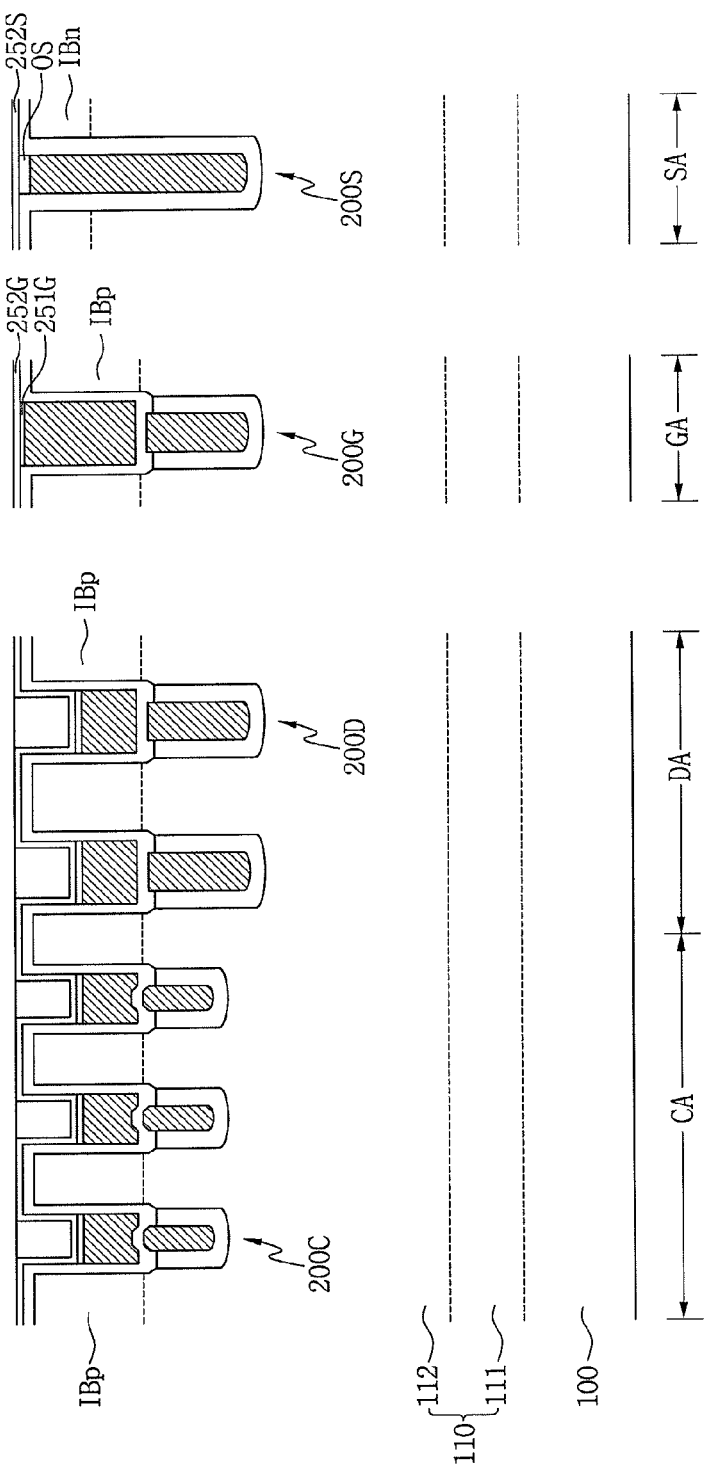

Referring to FIG. 3M, the method may include a process of implanting p-type impurities, such as boron, into the upper portion of the upper channel layer 112 within the cell area CA, the dummy area DA, and the gate pickup area GA to form p-type impurity bodies IBp, and a process of implanting n-type impurities, such as phosphorous (P) or arsenic (As), into the upper portion of the upper channel layer 112 within the shield pickup area SA to form an n-type impurity body IBn.

Figure 3N:
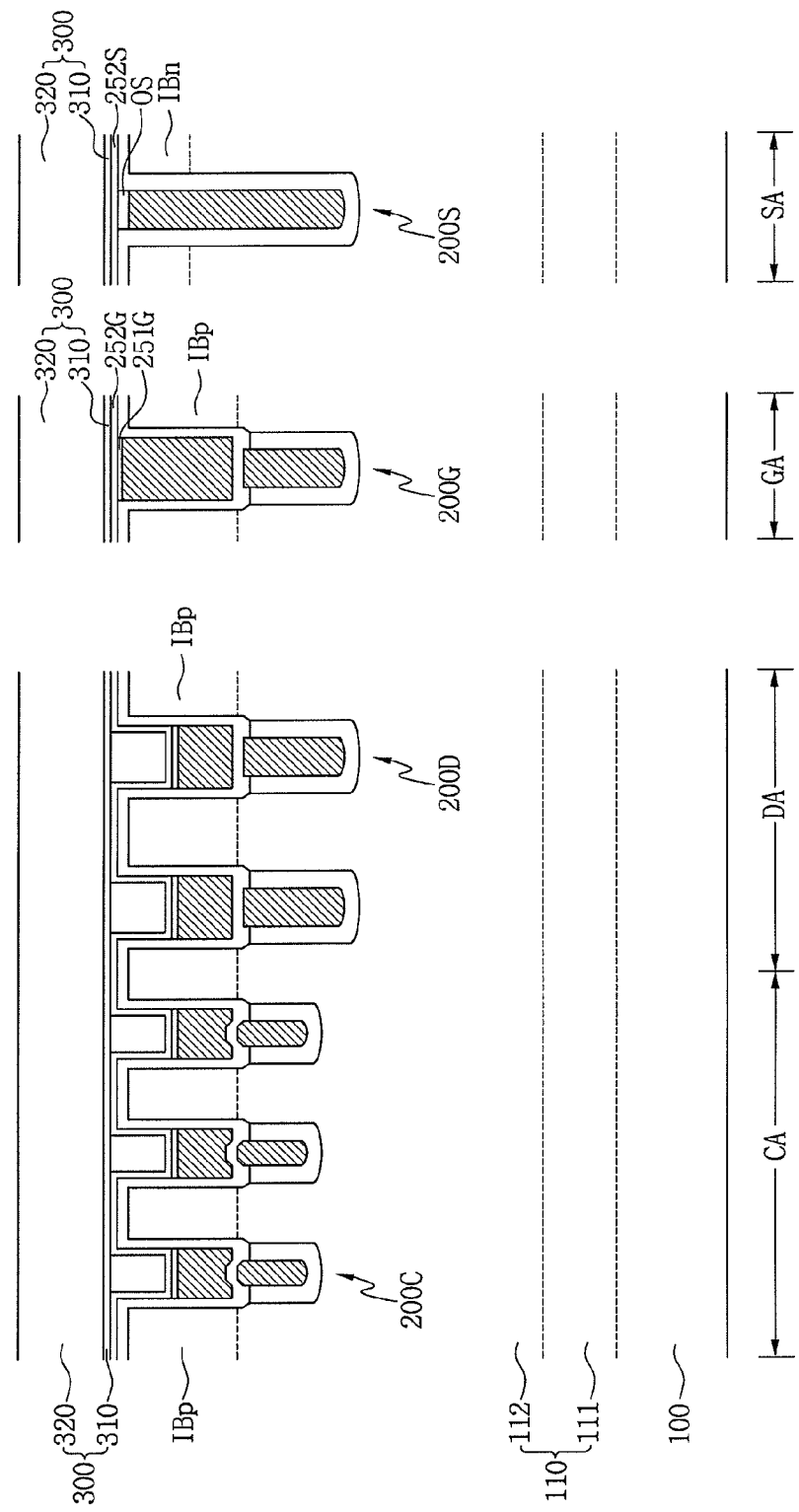

Referring to FIG. 3N, the method may include a process of forming an interlayer insulating layer 300 on the resultant structure. In some embodiments, the interlayer insulating layer 300 may include a lower interlayer insulating layer 310 and an upper interlayer insulating layer 320. In some embodiments, the lower interlayer insulating layer 310 may include silicon nitride formed using a CVD process. In some embodiments, the upper interlayer insulating layer 320 may include silicon oxide formed using a CVD process.

Referring to FIG. 3O, the method may include a process of forming a mask pattern M3 that exposes the entire cell area CA and a part of the dummy area DA and exposes the gate pickup area GA and the shield pickup area SA, a process of removing the interlayer insulating layer 300 and the cell capping stopper layer 252C covering the cell area CA, and a process of partly removing the cell gate insulating layer 231C to expose the upper channel layer 112. In some embodiments, the mask pattern M3 may include a photoresist pattern.

Figure 3P:
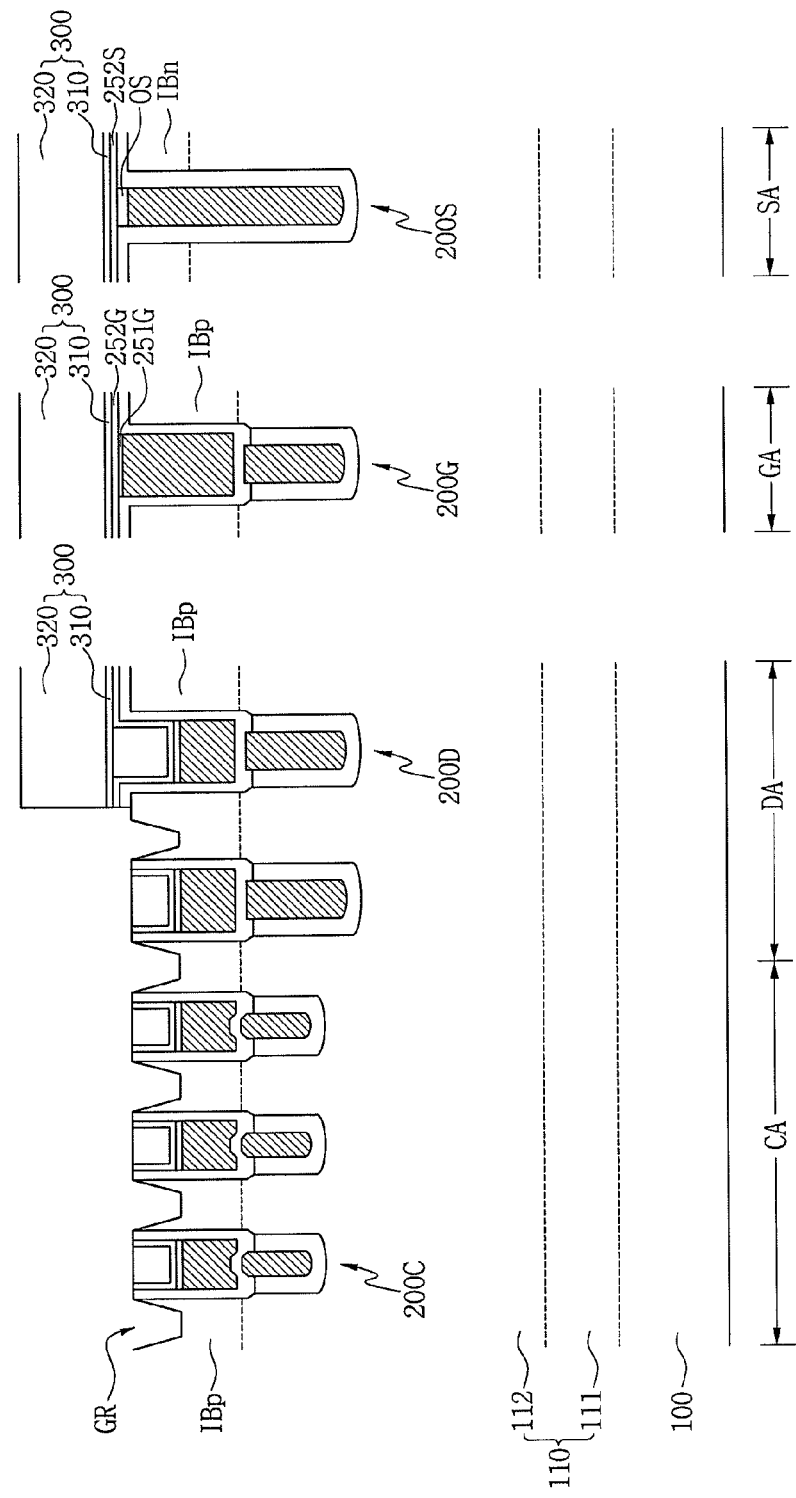

Referring to FIG. 3P, the method may include a process of inclinedly etching the exposed upper channel layer 112 within the cell area CA to form grooves GR having inclined sidewalls. Then, the mask pattern M3 may be removed. Alternatively, the mask pattern M3 may be removed after the following ion implantation processes are performed.

Referring to FIG. 3Q, the method may include a process of implanting p-type impurities into lower portions of bottoms of the grooves GR to form source isolation regions 410. The source isolation regions 410 may be formed so as to follow the profiles of the grooves GR. Since, during this process, ions are implanted into the lower portions of the bottoms of the grooves GR, the source isolation regions 410 may be finely and elaborately formed using low energy. Since the source isolation regions 410 have a shallow depth and a relatively small, or thin, thickness, it is possible to very accurately control the position, depth, thickness, and concentration of each source isolation region 410.

Figure 3R:
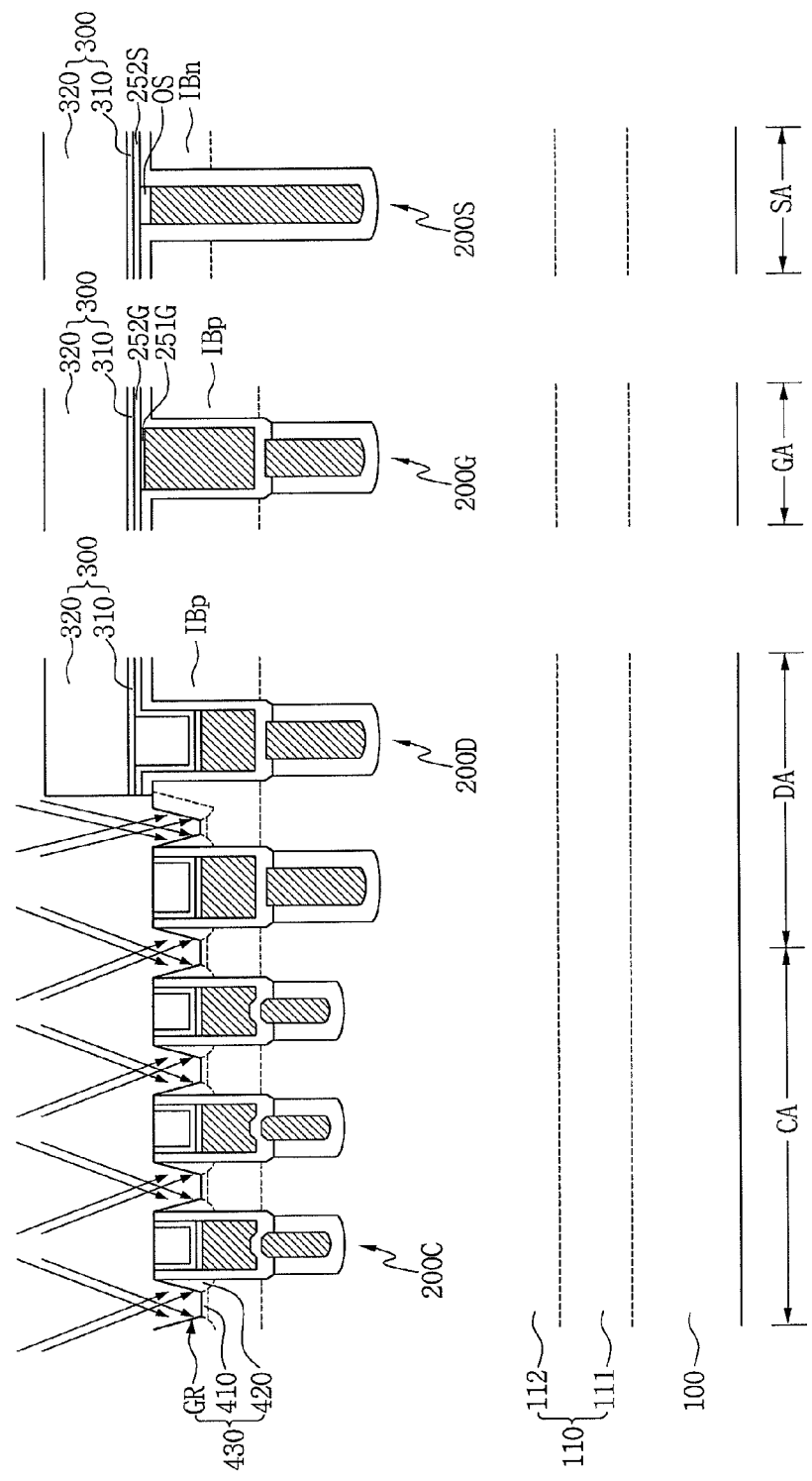

Referring to FIG. 3R, the method may include a process of implanting n-type impurities into opposite sidewalls of the grooves GR using an inclined ion implantation process to form source regions 420. As a result of the inclined ion implantation process, internal regions of the opposite sidewalls of the grooves GR may be reversed from a p type to an n type. Afterward, the mask pattern M3 may be removed. In this process, source contact regions 430 including the source isolation regions 410 under the bottoms of the grooves GR and the source regions 420 under the sidewalls of the grooves GR, may be formed. Since the source regions 420 are formed using an inclined etch process, they can be formed so as to have an accurate concentration at an accurate position.

Figure 3S:
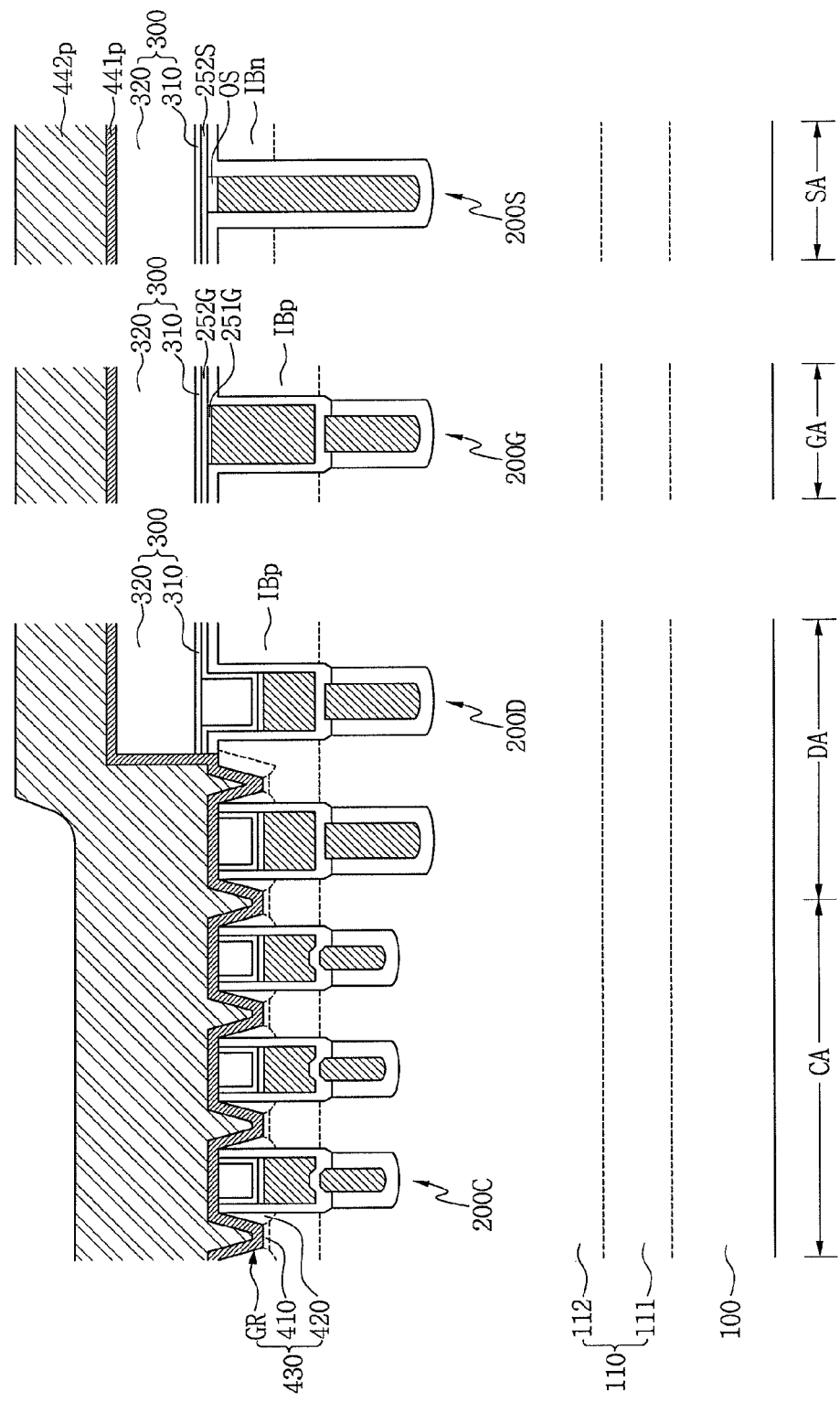

Referring to FIG. 3S, the method may include a process of forming a preliminary source barrier metal layer 441p so as to cover the source contact regions 430, for instance, the bottoms and inner walls of the grooves GR as a whole, and a process of forming a preliminary source electrode metal layer 442p on the preliminary source barrier metal layer 441p so as to fill the grooves GR. In some embodiments, the preliminary source barrier metal layer 441p may include at least one of Ti, TiN, Ta, TaN, TiW, WN, and other suitable barrier metals. In some embodiments, the preliminary source electrode metal layer 442p may include a metal or a metal alloy.

Figure 3T:
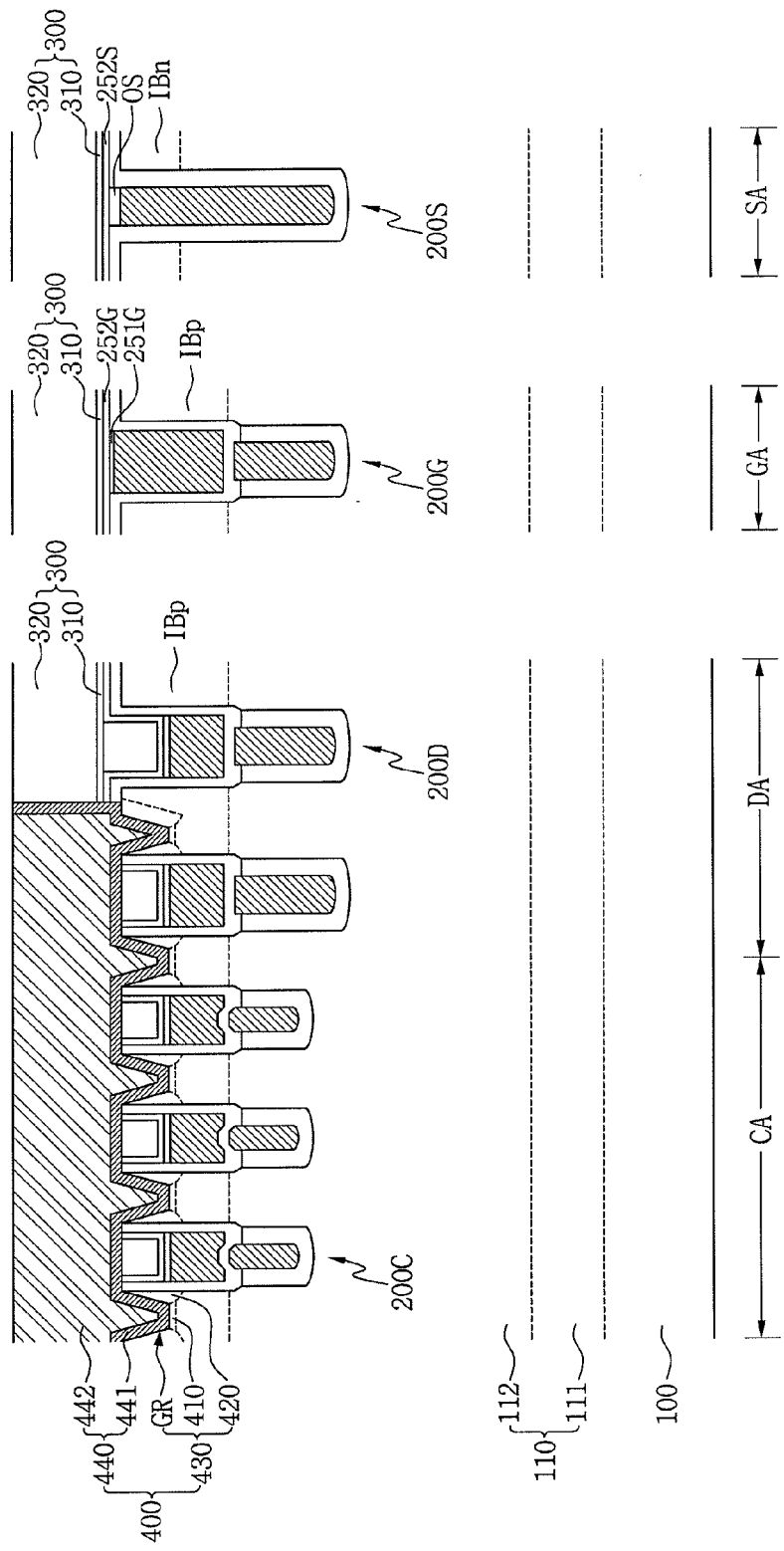

Referring to FIG. 3T, the method may include a process of planarizing the preliminary source electrode metal layer 442p and the preliminary source barrier metal layer 441p to form a source electrode pattern 440 including a source electrode metal layer 442 and a source barrier metal layer 441. The preliminary source electrode metal layer 442p and the preliminary source barrier metal layer 441p on the upper interlayer insulating layer 320 within the dummy area DA, the gate pickup area GA, and the shield pickup area SA may be removed, and thereby the upper interlayer insulating layer 320 may be exposed. A source pattern 400 including the source isolation regions 410 under the bottoms of the grooves GR, the source regions 420 of the sidewalls of the grooves GR, and the source electrode pattern 440 filling the grooves GR, may be formed.

Figure 3U:
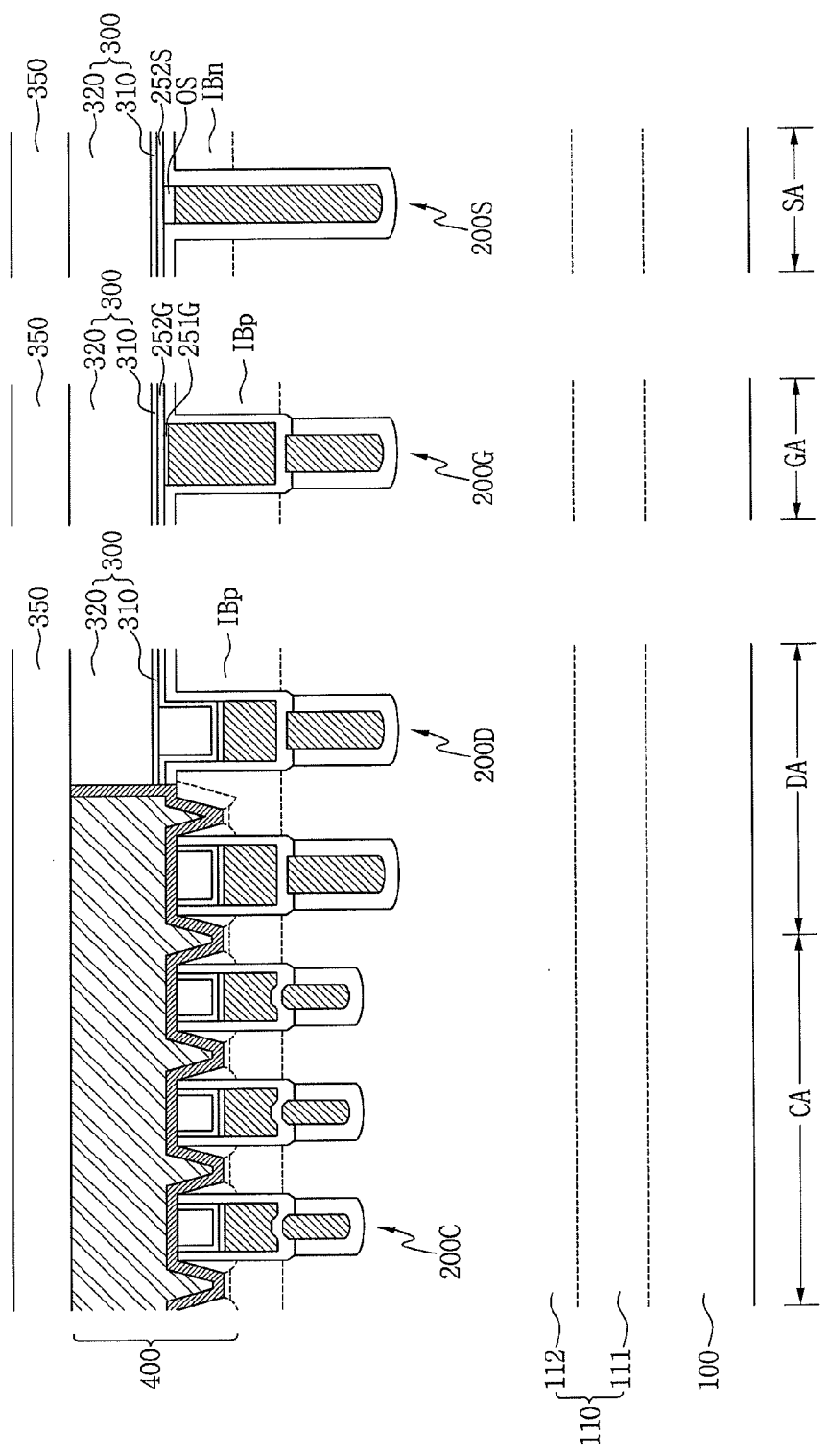

Referring to FIG. 3U, the method may include a process of forming a passivation layer 350 on the source electrode 440. In various embodiments, the passivation layer 350 may include a single insulating layer or multiple insulating layers including silicon oxide, silicon nitride, or polyimide.

Figure 3V:
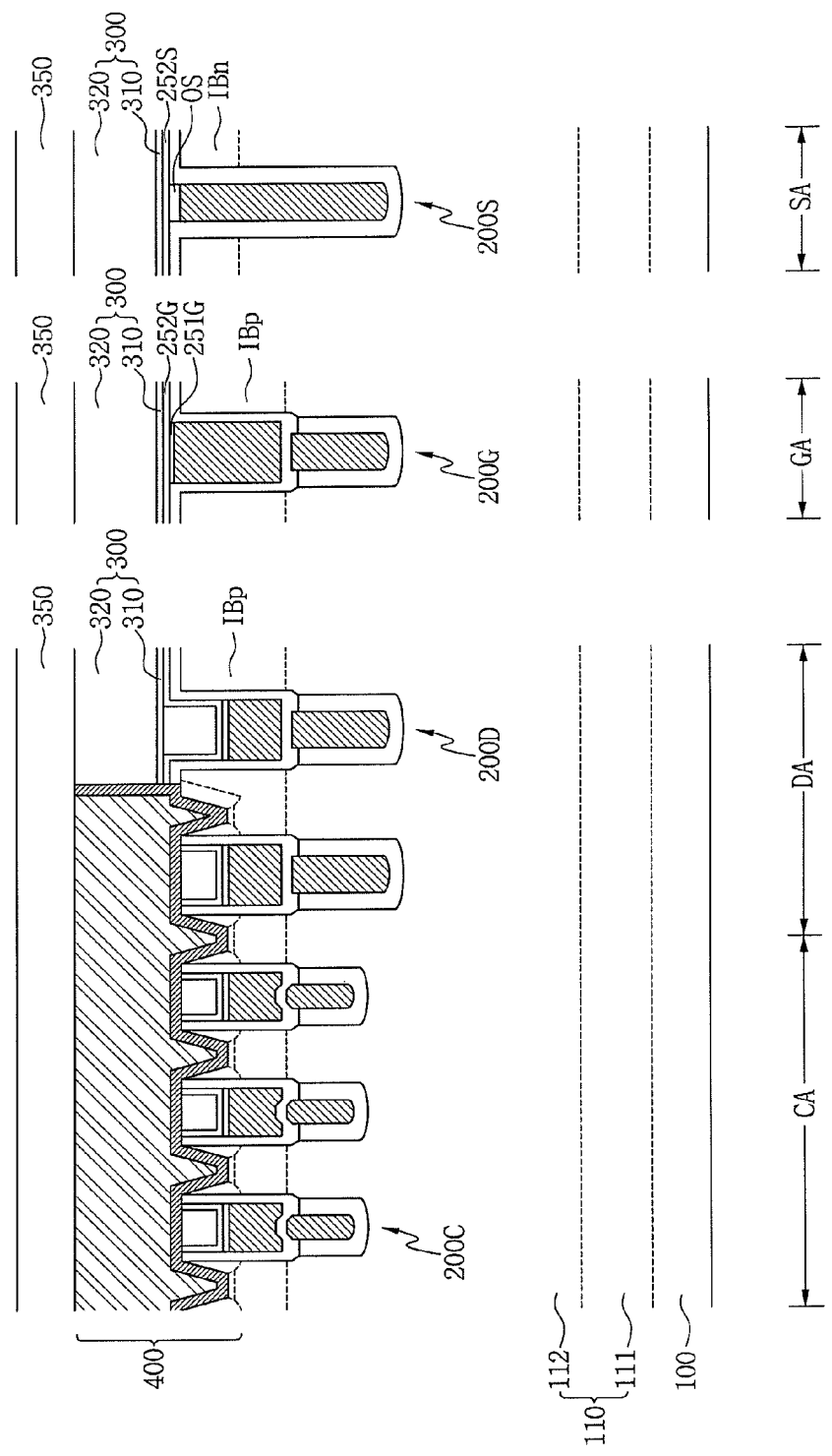

Referring to FIG. 3V, the method may include a process of recessing a lower surface of the substrate 100 using a grinding and/or etch-back process to reduce a thickness of the substrate 100.

Afterwards, the method may include a process of forming a drain electrode 500 on the lower surface of the substrate 100 with reference to FIGS. 1A to 1E. In some embodiments, the drain electrode 500 may include a material including a metal.

Figure 4A:
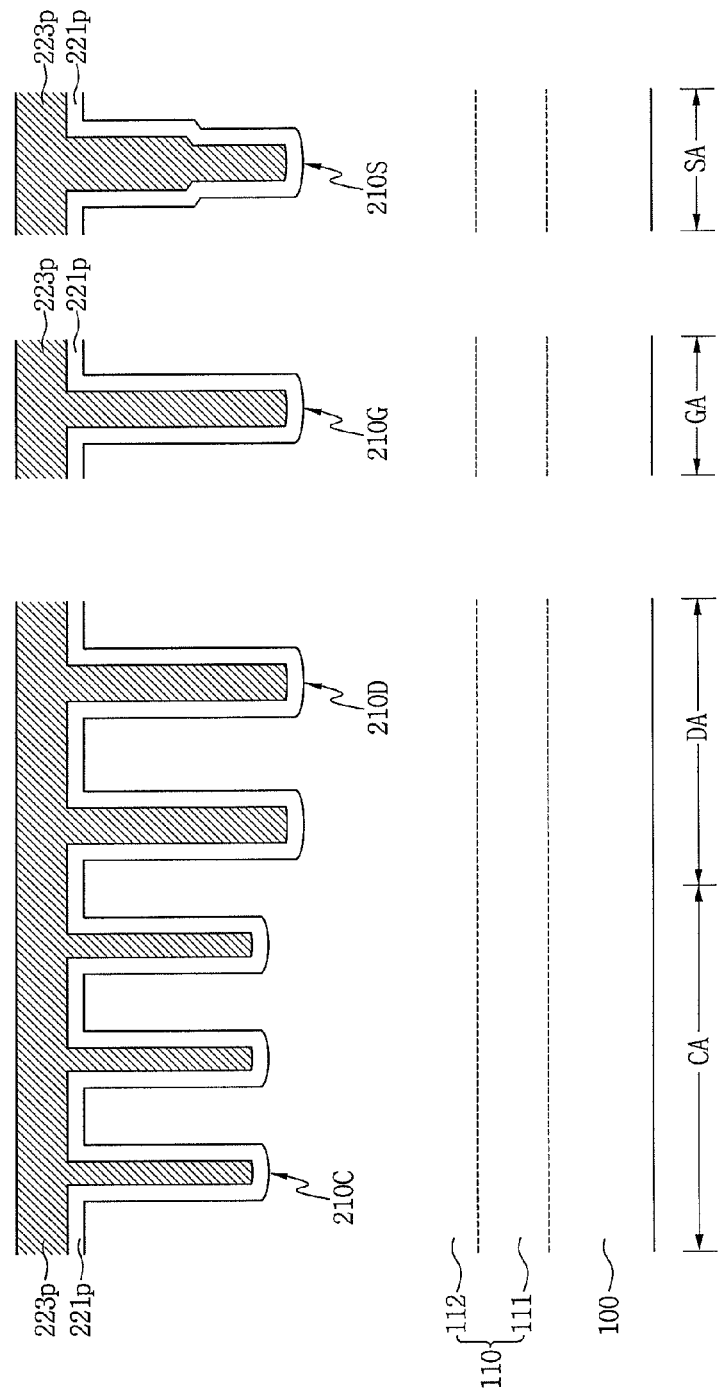

Referring to FIG. 4A, in another embodiment, the method may include, after the process of FIG. 3A is performed, a process of forming trenches 210C, 210D, 210G, and 210S in the upper channel layer 112, a process of conformally forming a preliminary shield insulating layer 221p on inner walls of the trenches 210C, 210D, 210G, and 210S and an upper surface of the upper channel layer 112, and a process of forming a preliminary shield electrode 223p so as to fill the trenches 210C, 210D, 210G, and 210S. The trenches 210C, 210D, 210G, and 210S may include cell trenches 210C within the cell area CA, dummy trenches 210D within the dummy area DA, a gate pickup trench 210G within the gate pickup area GA, and a shield pickup trench 210S within the shield pickup area SA. The dummy trenches 210D, the gate pickup trench 210G, and the shield pickup trench 210S may be formed so as to be deeper and wider than the cell trenches 210C. Further, the shield pickup trench 210S may be formed so that an upper width thereof is wide, and a lower width thereof is narrow.

In some embodiments, the preliminary shield insulating layer 221p may include silicon oxide formed using an oxidation process, a sub-atmosphere CVD process, or an ALD process. In some embodiments, the preliminary shield electrode 223p may include polysilicon formed using a CVD process.

Figure 4B:
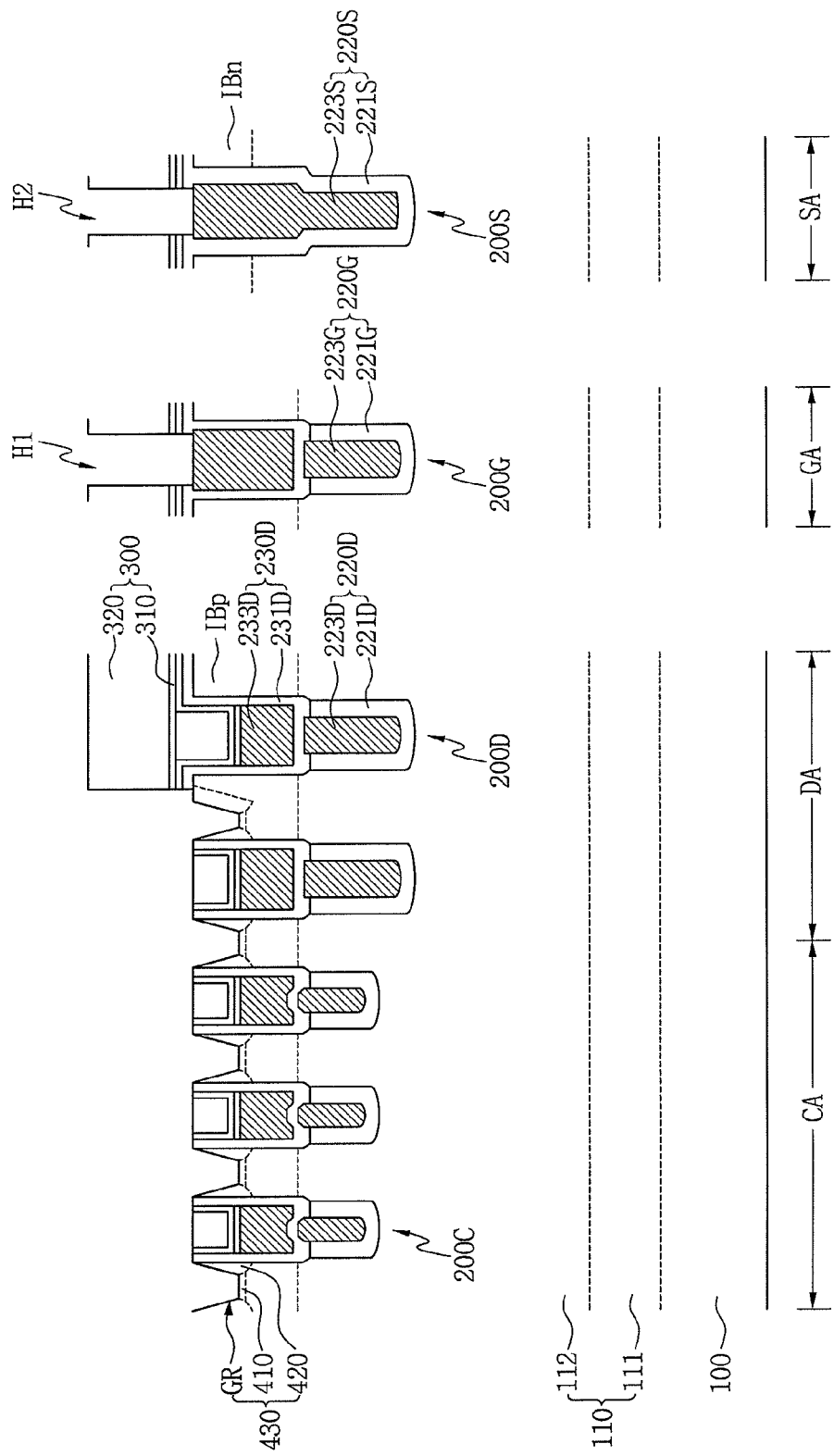

Referring to FIG. 4B, the method may optionally include, after the processes described with reference to FIGS. 3C to 3R are performed, a process of forming holes H1 and H2 exposing the gate pickup electrode 233G and the shield pickup electrode 223S.

Figure 4C:
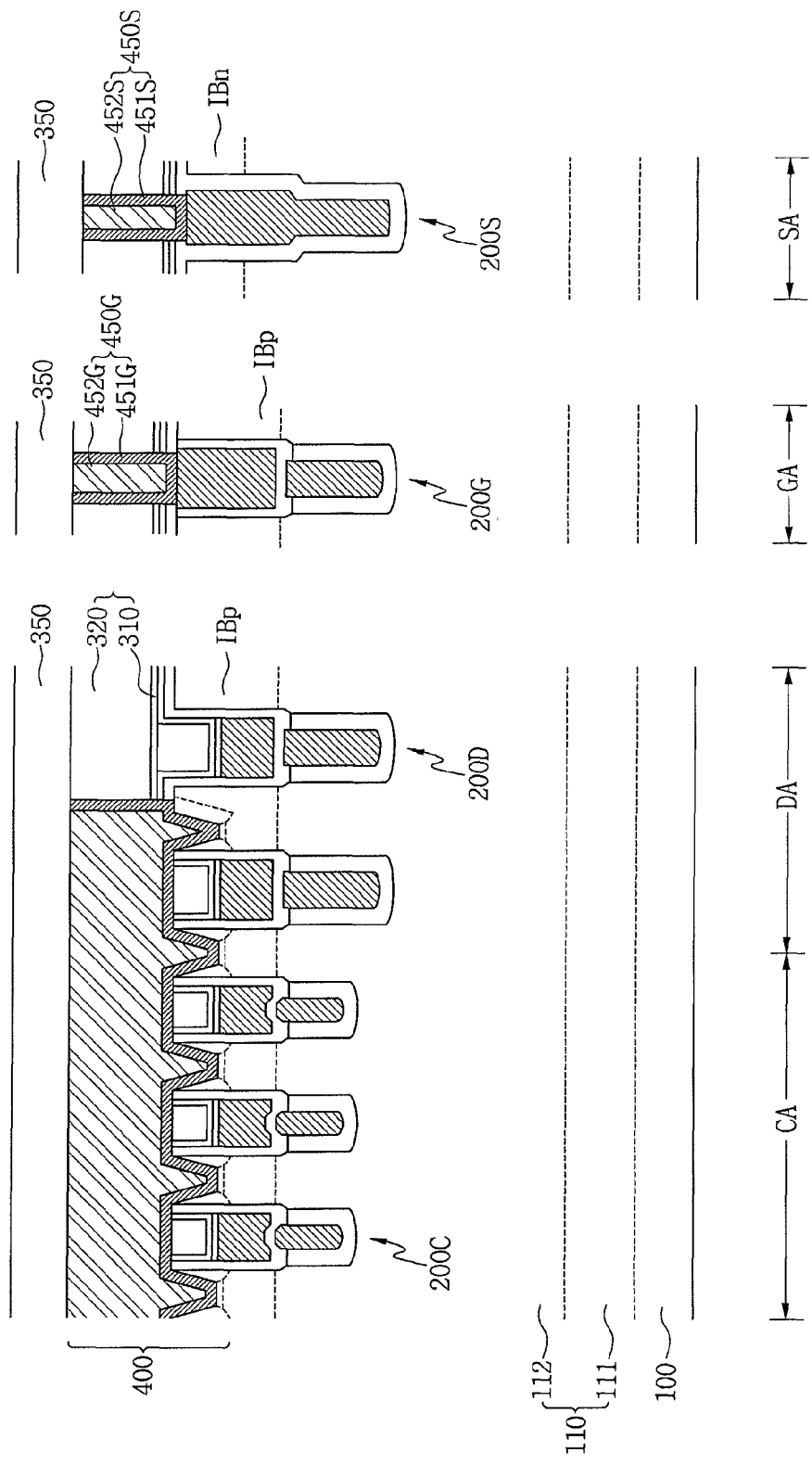

Referring to FIG. 4C, the method may optionally include, after the processes described with reference to FIGS. 3S to 3V are performed, a process of forming a gate pickup pattern 450G and a shield pickup pattern 450S, and a process of recessing a lower surface of the substrate 100. In some embodiments, the gate pickup pattern 450G may include a gate pickup barrier metal layer 451G and a gate pickup metal layer 452G, and the shield pickup pattern 450S may include a shield pickup barrier metal layer 451S, and a shield pickup metal layer 452S.

The method may further optionally include a process of forming a drain electrode 500 on the lower surface of the substrate 100 with reference to FIGS. 2A to 2C.

Figure 5A:
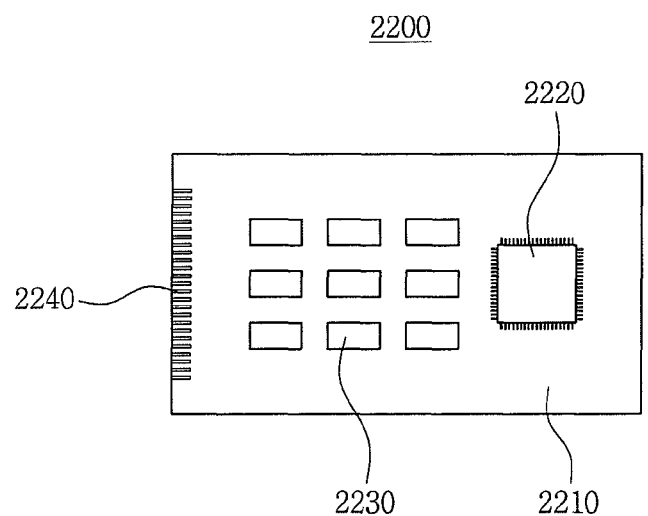
FIGS. 5A to 5D show a semiconductor module, electromagnetic systems, and a mobile device including the semiconductor devices in accordance with embodiments of the inventive concept.

Referring to FIG. 5A, a semiconductor module 2200 according to the inventive concept may include a semiconductor device 2230 according to the inventive concepts which is mounted on a module board 2210. The semiconductor module 2200 may further include a microprocessor 2220 mounted on the module board 2210. Input/output terminals 2240 may be disposed on at least one side of the module board 2210.

Figure 5B:
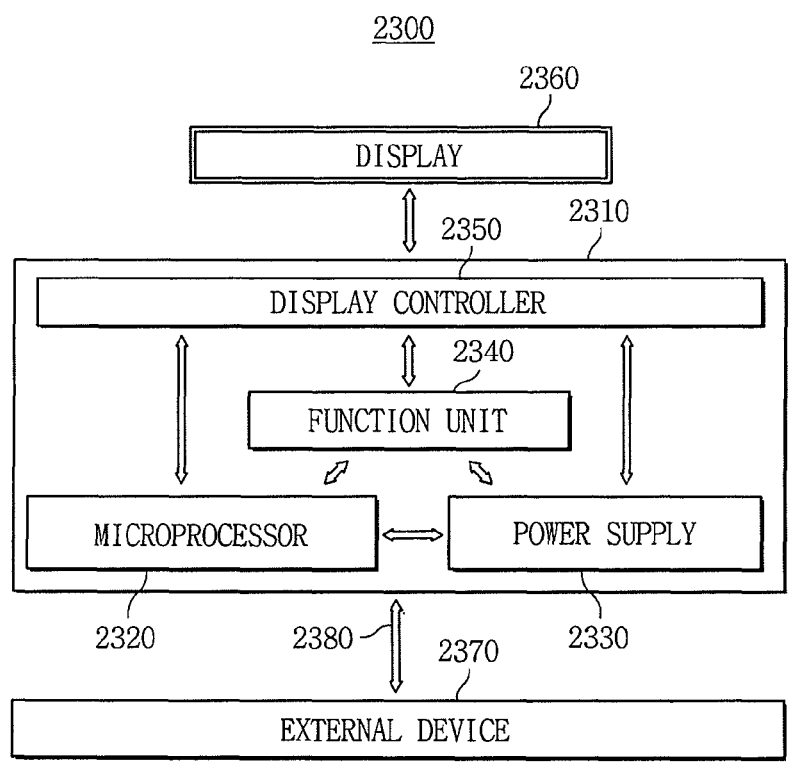

Referring to FIG. 5B, the semiconductor device according to the inventive concepts may be applied to an electromagnetic system 2300. The electromagnetic system 2300 may include a body 2310. The body 2310 may include a microprocessor unit 2320, a power supply 2330, a function unit 2340, and/or a display controller unit 2350. The body 2310 may be a system board or a motherboard having a printed circuit board (PCB). The microprocessor unit 2320, the power supply 2330, the function unit 2340, and the display controller unit 2350 may be mounted on the body 2310. A display unit 2360 may be disposed on the top of the body 2310 or outside the body 2310. For example, the display unit 2360 may be disposed on a surface of the body 2310, and display an image processed by the display controller unit 2350. The power supply 2330 may be supplied with a predetermined voltage from an external power source, divide the voltage into various levels, and supply those voltages to the microprocessor unit 2320, the function unit 2340, and the display controller unit 2350. The microprocessor unit 2320 may be supplied with the voltage from the power supply 2330, thereby controlling the function unit 2340 and the display unit 2360. The function unit 2340 may perform various functions of the electromagnetic system 2300. For example, if the electromagnetic system 2300 is a mobile electromagnetic product such a mobile phone, the function unit 2340 may include various components that can perform wireless communication functions such as image output, voice output to a speaker, by dialing or communication with an external apparatus 2370. If the electromagnetic system 2300 includes a camera, the function unit 2340 may serve as an image processor. In another embodiment, if the electromagnetic system 2300 is connected to a memory card for capacity expansion, the function unit 2340 may be a memory card controller. The function unit 2340 may send/receive a signal to/from the external apparatus 2370 via a wired or wireless communication unit 2380. Further, if the electromagnetic system 2300 requires a universal serial bus (USB) for function expansion, the function unit 2340 may serve as an interface controller. The semiconductor device 10A or 10B according to the inventive concept may be included in at least one of the microprocessor unit 2320 and the function unit 2340.

Figure 5C:
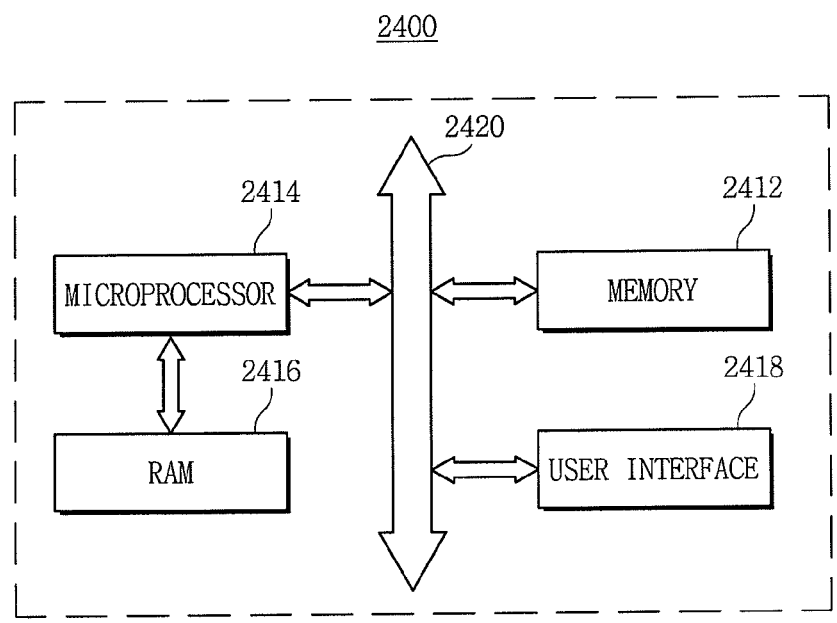

Referring to FIG. 5C, an electromagnetic system 2400 may include the semiconductor device according to the inventive concept. The electromagnetic system 2400 may be used to manufacture a mobile device or a computer. For example, the electromagnetic system 2400 may include a memory 2412, a microprocessor 2414 performing data communication via a bus 2420, a random access memory (RAM) 2416, and a user interface 2418. The microprocessor 2414 may program and control the electromagnetic system 2400. The RAM 2416 may be used as an operation memory of the microprocessor 2414. For example, the microprocessor 2414 or the RAM 2416 may include at least one of the semiconductor devices according to the embodiments of the inventive concept. The microprocessor 2414, the RAM 2416, and/or other components may be assembled in a single package. The user interface 2418 may be used to input data to the electromagnetic system 2400, or to output data from the electromagnetic system 2400. The memory 2412 may store codes for operating the microprocessor 2414, data processed by the microprocessor 2414, or external input data. The memory 2412 may include a controller and a memory device.

Figure 5D:
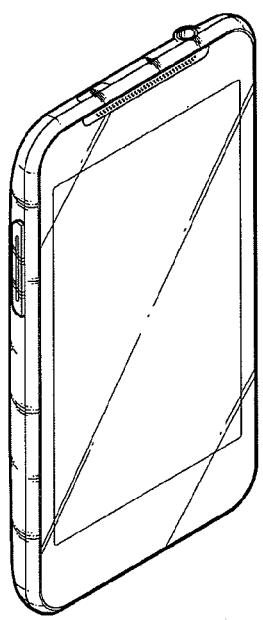

FIG. 5D schematically shows a mobile device 2500 including the semiconductor device according to the inventive concept. The mobile device 2500 may be understood to be a tablet personal computer (PC). In addition, the semiconductor device according to the inventive concept may be used for a portable computer such as a laptop computer, a MPEG-1 or MPEG-2 Audio Layer III (MP3) player, an MP4 player, a navigation device, a solid state disk (SSD), a desktop computer, a vehicle, and a household electric appliance, in addition to the tablet PC.

Semiconductor devices in accordance with various embodiments of the inventive concepts are suitable for enhanced switching performance.

Semiconductor device in accordance with embodiments of the inventive concepts are configured so that a contact area of the source region with the source electrode is increased, and thus contact resistance can be reduced.

Semiconductor devices in accordance with embodiments of the inventive concepts are configured so that an electrical short-circuit phenomenon between the source regions can be reliably prevented.

Semiconductor devices in accordance with embodiments of the inventive concepts are configured so that power efficiency can be improved.

Semiconductor devices in accordance with various embodiments of the inventive concept are fabricated by numerous planarization processes among various fabrication processes, so that process uniformity is excellent, and thus components can be highly integrated.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims.

What is claimed is:

1. A semiconductor device, comprising:
   a channel layer on a substrate;
   cell trench patterns and dummy trench patterns in the channel layer, each of the cell trench patterns including a cell shield pattern at a lower region of a cell trench, a cell gate pattern at a middle region of the cell trench, and a cell capping pattern at an upper region of the cell trench, and each of the dummy trench patterns including a dummy trench wider and deeper than the cell trench, a dummy shield pattern at a lower region of the dummy trench, a dummy gate pattern at a middle region of the dummy trench, and a dummy capping pattern at an upper region of the dummy trench;
   a source electrode on the cell trench patterns filling grooves between the cell trench patterns or the cell trench patterns and the dummy trench patterns;
   source isolation regions below bottom surfaces of the grooves;
   source regions under inclined sidewalls of the grooves and extending below the bottom surfaces of the grooves; and
   an interlayer insulating layer on the dummy trench patterns,
   wherein an upper surface of the source electrode on the cell trench pattern is flat, and a level of the upper surface of the source electrode is at the same level as an upper surface of the interlayer insulating layer on the dummy trench patterns, and
   wherein an impurity concentration of each source region is higher than that of each source isolation region.

2. The semiconductor device of claim 1, wherein the dummy trench patterns neighbor a portion of the cell trench patterns, and,
   wherein an upper surface of the source electrode is at a same vertical position as an upper surface of the interlayer insulating layer, and
   wherein each of the dummy trench patterns includes a dummy trench wider and deeper than the cell trench, a dummy shield pattern at a lower region of the dummy trench, a dummy gate pattern at a middle region of the dummy trench, and a dummy capping pattern at an upper region of the dummy trench.

3. The semiconductor device of claim 1, further comprising a gate pickup trench pattern in the channel layer,
   wherein the gate pickup trench pattern includes a gate pickup trench wider and deeper than the cell trench, a gate pickup shield pattern at a lower region of the gate pickup trench, and a gate pickup pattern at an upper region of the gate pickup trench, and
   an upper surface of the dummy capping pattern is at a same vertical position as an upper surface of the gate pickup pattern.

4. The semiconductor device of claim 2, further comprising a shield pickup trench pattern in the channel layer,
   wherein the shield pickup trench pattern includes a shield pickup trench wider and deeper than the cell trench, a shield pickup pattern being positioned in the shield pickup trench, and
   wherein the upper surface of the dummy capping pattern is at a same vertical position as an upper surface of the shield pickup pattern.

* * * * *